(12) United States Patent
Lee et al.

(10) Patent No.: US 12,360,677 B2
(45) Date of Patent: Jul. 15, 2025

(54) ERASE TYPE DETECTION MECHANISM

(71) Applicant: Western Digital Technologies, Inc., San Jose, CA (US)

(72) Inventors: YunKyu Lee, SeongNam (KR); SangYun Jung, YongIn (KR); Minyoung Kim, Suwon (KR); SeungBeom Seo, Seoul (KR); MinWoo Lee, Hwasung (KR)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/485,050

(22) Filed: Oct. 11, 2023

(65) Prior Publication Data

US 2025/0123751 A1    Apr. 17, 2025

(51) Int. Cl.
*G06F 3/06* (2006.01)
*G11C 16/34* (2006.01)

(52) U.S. Cl.
CPC ............ *G06F 3/0616* (2013.01); *G06F 3/064* (2013.01); *G06F 3/0652* (2013.01); *G06F 3/0659* (2013.01); *G06F 3/0679* (2013.01); *G11C 16/3445* (2013.01)

(58) Field of Classification Search
None
See application file for complete search history.

(56) References Cited

U.S. PATENT DOCUMENTS

| 6,639,843 | B2 | 10/2003 | Miyauchi |
| 6,977,847 | B2 | 12/2005 | Lasser et al. |
| 8,151,034 | B2 | 4/2012 | Gorobets et al. |
| 9,159,423 | B1 | 10/2015 | Brahmadathan et al. |
| 9,792,998 | B1 | 10/2017 | Yang et al. |
| 11,733,914 | B2 * | 8/2023 | Raju ..................... G06F 3/0619 711/154 |

(Continued)

FOREIGN PATENT DOCUMENTS

CN    113010458 B    1/2023

OTHER PUBLICATIONS

International Search Report and Written Opinion received for PCT Patent Application No. PCT/US2024/031426, mailed on Sep. 23, 2024, 10 pages.

*Primary Examiner* — Nathan Sadler
(74) *Attorney, Agent, or Firm* — ARENTFOX SCHIFF LLP

(57) ABSTRACT

Aspects of a storage device are provided for handling detection and operations associated with an erase block type of the block. The storage device includes one or more non-volatile memories each including a block, and one or more controllers operable to cause the storage device to perform erase type detection and associated operations for single blocks or metablocks. For instance, the controller(s) may erase the block prior to a power loss event, perform at least one read of the block following the power loss event, identify the erase block type of the block in response to the at least one read, and program the block based on the identified erase block type without performing a subsequent erase prior to the program. The controller(s) may also perform metablock operations associated with the identified erase block type. Thus, unnecessary erase operations during recovery from an ungraceful shutdown (UGSD) may be mitigated.

18 Claims, 20 Drawing Sheets

(56) References Cited

U.S. PATENT DOCUMENTS

| | | | |
|---|---|---|---|
| 11,756,637 B2* | 9/2023 | Lonin | G11C 16/3404 |
| | | | 365/185.22 |
| 11,798,643 B1* | 10/2023 | Bhat | G06F 3/0679 |
| 2010/0095148 A1 | 4/2010 | Cheng | |
| 2016/0004464 A1 | 1/2016 | Shen | |
| 2019/0278490 A1 | 9/2019 | Muchherla et al. | |
| 2023/0140773 A1* | 5/2023 | Raju | G06F 3/064 |
| | | | 711/154 |
| 2023/0152995 A1* | 5/2023 | Doni | G06F 3/0659 |
| | | | 711/154 |
| 2023/0162808 A1 | 5/2023 | Ionin et al. | |
| 2024/0069730 A1* | 2/2024 | Yamparala | G06F 3/0604 |
| 2024/0069735 A1* | 2/2024 | Yeung | G06F 3/0679 |

* cited by examiner

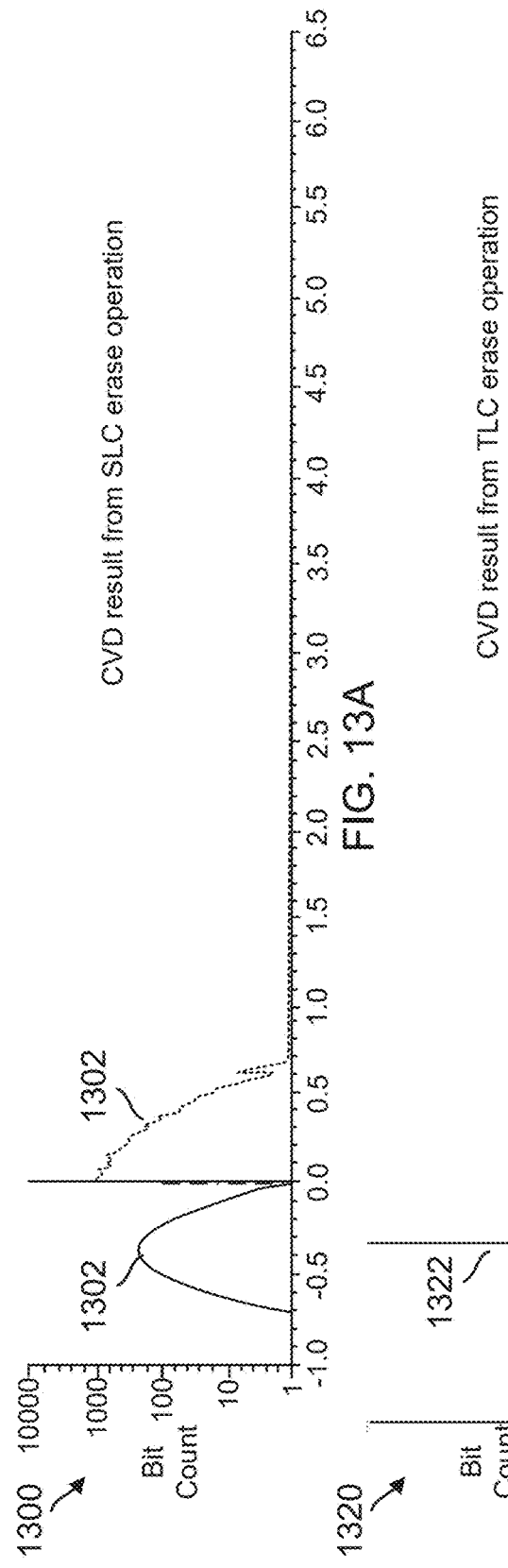
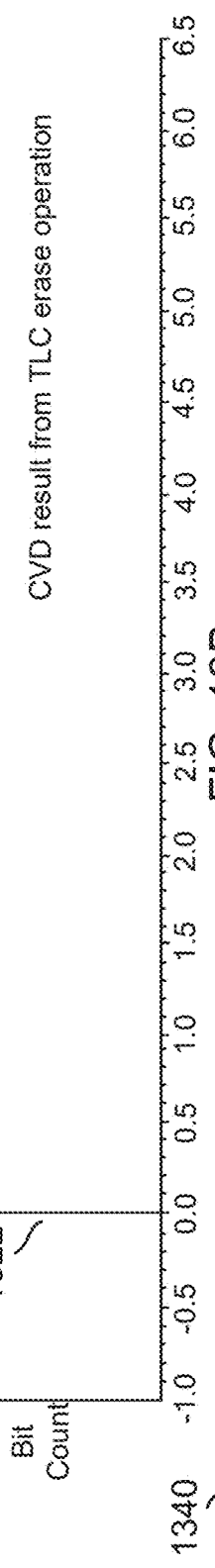
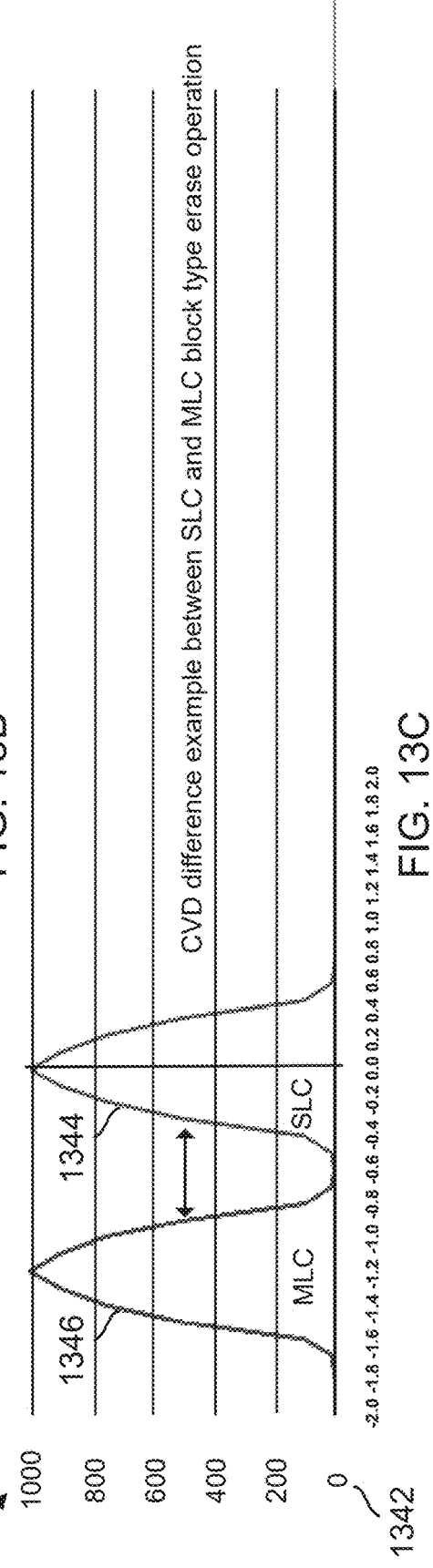
FIG. 13A
FIG. 13B
FIG. 13C

ERASE TYPE DETECTION MECHANISM

TECHNICAL FIELD

This disclosure is generally related to electronic devices, and more particularly, to storage devices handling detection and operations associated with erase block types.

DESCRIPTION OF THE RELATED TECHNOLOGY

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

In prior approaches to managing NAND flash memory, particularly in the context of SSDs utilizing multi-level cell (e.g., MLC, TLC, QLC, and N-Level Cell or XLC) blocks, controller firmware (FW) may temporarily use MLC blocks as single-level cell (SLC) blocks to enhance performance. The FW may also store erased block type information for the MLC blocks before an unexpected power reset occurs so that the FW may manage appropriate erase block types during operation to avoid uncorrectable data read conditions. However, if an unexpected power reset occurs before saving the erased block type information, current FW may erase the block again to synchronize the block type information for the next program operation. This additional erase operation unnecessarily increases the Program-Erase Cycle (PEC) count of the block, negatively impacting the SSD's lifespan.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

One innovative aspect of the subject matter described in this disclosure may be implemented in a storage device. The storage device includes one or more non-volatile memories each including a block, and one or more controllers each communicatively coupled with at least one of the one or more non-volatile memories. The one or more controllers, individually or in any combination, are operable to cause the storage device to erase the block prior to a power loss event, the block being associated with an erase block type, to perform at least one read of the block following the power loss event, to identify the erase block type of the block in response to the at least one read, and to program the block based on the identified erase block type without performing a subsequent erase prior to the program.

Another innovative aspect of the subject matter described in this disclosure may be implemented in a method for handling detection and operations associated with an erase block type of a block in one or more non-volatile memories of a storage device. The method may be performed in the storage device following erasure of the block prior to a power loss event. The method includes performing at least one read of the block following the power loss event, identifying the erase block type of the block in response to the at least one read, and programming the block based on the identified erase block type without performing a subsequent erase prior to the program.

A further innovative aspect of the subject matter described in this disclosure may be implemented in a storage device. The storage device includes one or more non-volatile memories each including a block, and means for handling detection and operations associated with an erase block type of the block following erasure of the block prior to a power loss event. The means for handling is configured to perform at least one read of the block following the power loss event, identify the erase block type of the block in response to the at least one read, and program the block based on the identified erase block type without performing a subsequent erase prior to the program.

It is understood that other aspects of the present disclosure will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present disclosure will now be presented in the detailed description by way of example, and not by way of limitation, with reference to the accompanying drawings, wherein:

FIGS. 13A-C are graphical diagrams respectively illustrating examples of a cumulative voltage distribution (CVD) for SLC erase operations, a CVD for triple-level cell (TLC) erase operations, and a difference in CVDs for SLC and multi-level cell (MLC) erase operations occurring in the storage device of FIG. 1.

DETAILED DESCRIPTION

Figure 1:
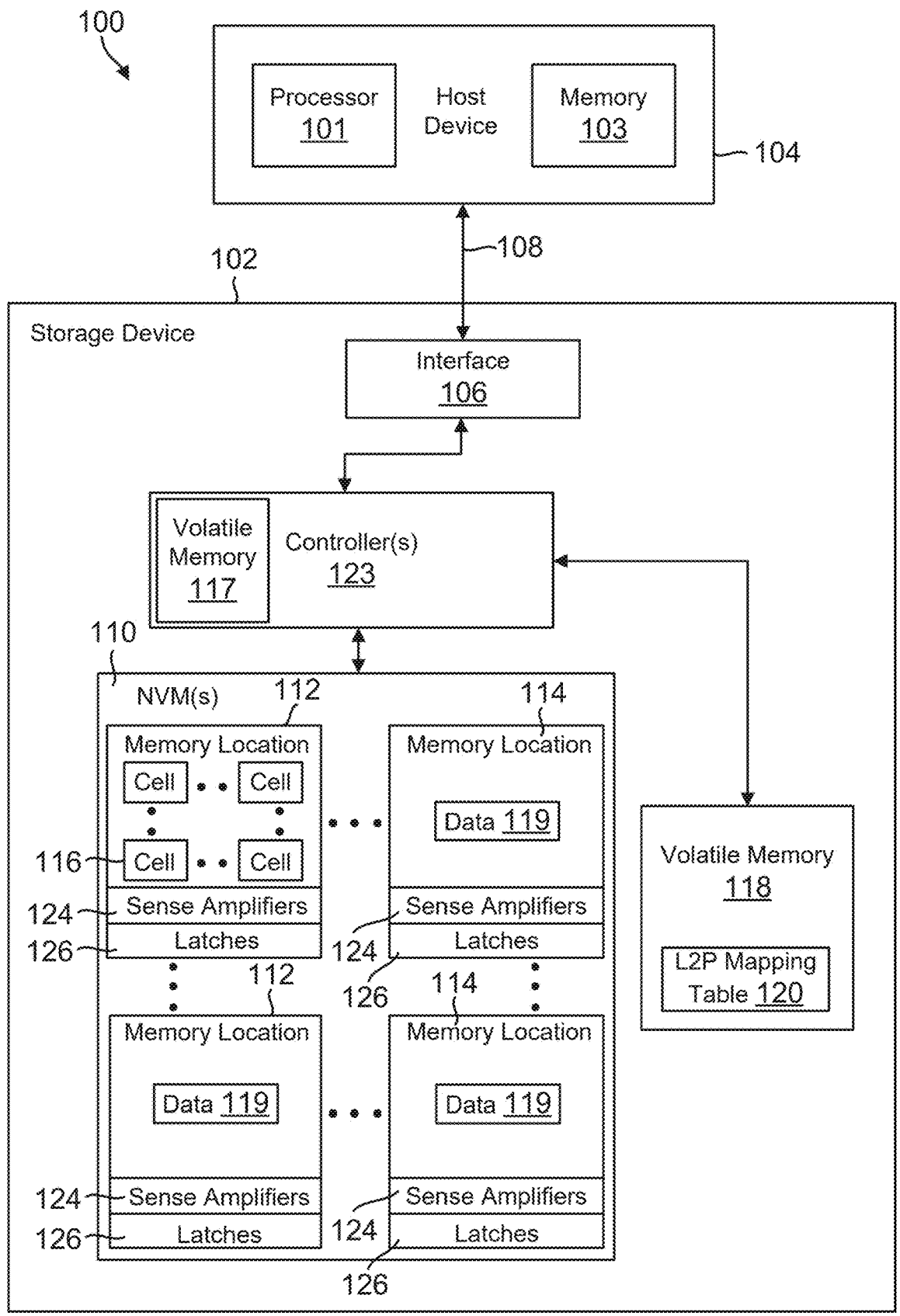
FIG. 1 is a block diagram illustrating an exemplary embodiment of a storage device in communication with a host device.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Acronyms and other descriptive terminology may be used merely for convenience and clarity and are not intended to limit the scope of these concepts.

Several aspects of a storage device in communication with a host device will now be presented with reference to various apparatus and methods. These aspects are well suited for flash storage devices, such as solid-state devices (SSDs) and Secure Digital (SD) cards. However, those skilled in the art will realize that these aspects may be extended to all types of storage devices capable of storing data. Accordingly, any reference to a specific apparatus or method is intended only to illustrate the various aspects of the present disclosure, with the understanding that such aspects may have a wide range of applications without departing from the spirit and scope of the present disclosure.

Storage devices may include a hybrid single-level-cell (hSLC) feature that allows controller firmware (FW) to temporarily utilize a triple-level-cell (TLC) block (or other multi-level-cell (MLC) block) as a single-level-cell (SLC) block, enhancing host write performance. The firmware stores the erased block type information (SLC erase or TLC erase) for TLC blocks before a power reset to prevent an uncorrectable data read (UECC) condition. Generally, when an ungraceful shutdown (UGSD) occurs immediately after a hybrid SLC (hSLC) allocated block erase operation, the FW examines potential SLC erased blocks in the un-erased block list during the UGSD recovery process. However, since the FW cannot determine the erased block type before the UGSD in the TLC block pool, it carries out a flash fill and erase operation on the hybrid SLC allocated blocks to synchronize the block type information for subsequent program operations. This flash fill and erasing operation unnecessarily increases the program-erase cycle (PEC) count of the blocks, impacting the storage device's lifespan. To address this inefficiency, the storage device of the present disclosure may include an erase type detection mechanism which allows the controller to identify the erase type of erased hybrid blocks that may be lost during UGSD. As a result of this identification, the storage device may avoid performing a flash fill and erase operation during UGSD recovery, thereby avoiding inefficient increases in PEC in single block and metablock conditions.

NAND flash memory technology has certain limitations, particularly when it comes to the erase and program operations of multi-level cell blocks. One of these limitations is that multi-level cell blocks are to be erased as the same block type that is be used for the next program operation, since mismatched block types may cause data reliability errors. For instance, a MLC block type erase may be followed by a MLC block type program, while an SLC erase may be followed by an SLC program.

However, current SSD architectures use hybrid SLC technology to employ SLC blocks as a buffer to store the majority of Host Data in a multi-level cell block pool. Moreover, the average PEC for the end of life (EOL) of a device under test (DUT) varies depending on the type of NAND flash memory. For example, an MLC block pool typically has a much smaller PEC count compared to that of SLCs, as illustrated in Table 1. Similarly, the PEC ratio of hybrid SLCs to MLCs also differs across various Bit-Cost Scalable (BiCS) generations of NAND flash memory, such as illustrated in Table 2.

TABLE 1

Average PEC until EOL per each block type

| Block Type | Average PEC until EOL |
|---|---|
| SLC | 100,000 |
| MLC | 5000 |
| TLC | 3000 |
| QLC | 1000 |

TABLE 2 hSLC/TLC PEC ratio

| BICS Version | hSLC/TLC PEC Ratio | Description |
|---|---|---|
| BICS4 | 1.0 | 1 hSLC erase operation counts as 1 TLC erase operation |
| BICS5 | 1.3 | 1 hSLC erase operation counts as 1.3 TLC erase operations |
| BICS6 | 1.0 | 1 hSLC erase operation counts as 1 TLC erase operation |
| BICS8 | >1.0 | No data available, but it could be more than 1.0 |

The evolution of NAND Flash Technology has also resulted in larger block sizes, while the number of block counts per die has decreased, as illustrated in Table 3. Table 3 also shows that the block size of multi-level cell block types may be determined by the type of NAND flash memory (MLC: SLC×2, TLC: SLC×3, quad-level-cell (QLC): SLC×4), while the block count per plane for BiCS5 increased up to 4 times larger than BiCS4 due to the increase in die size (from 256 GB to 1 TB). Furthermore, as illustrated in Table 4, SSD manufacturers generally guarantee a specific data write size or amount until the end of the SSD lifecycle, such as 600 TB of write size for a 1 TB capacity model. However, as block sizes become larger, unnecessary erase operations leading to increased PEC may significantly impact the durability of the SSD, such as shown by the losable write sizes in Tables 4 and 5. Moreover, as NAND generations increase, the maximum losable write size may enlarge even further, such as up to 460 MB in the worst-case scenario for a BiCS6×3 (TLC) SSD.

TABLE 3

Block counts per 256 Gb DIE size

| | BiCS3 256 Gb | BiCS4 256 Gb | BiCS5 512 Gb | BiCS5 1 Tb | BiCS6 1 Tb |
|---|---|---|---|---|---|
| Word lines | 64 Wls | 96 Wls | 112 Wls | 112 Wls | 160 Wls |
| Strings | 4 | 4 | 4 | 4 | 5 |
| Pages per plane (SLC/TLC) | 256/ 768 | 384/ 1152 | 448/ 1344 | 448/ 1344 | 800/ 2400 |
| Planes per block | 2 | 2 | 2 | 2 | 4 |
| Block Size (SLC/TLC) | 4 MB/ 12 MB | 6 MB/ 18 MB | 7 MB/ 21 MB | 7 MB/ 21 MB | 12.8 MB/ 38.4 MB |
| Block Counts per plane | 1478 | 990 | 1662 | 3224 | 940 |
| Block Counts/256 Gb DIE size | 1478 | 990 | 831 | 831 | 470 |

TABLE 4

BICS4 512 Gb NAND

| Capacity | 500 GB | 1TB | 2TB |
|---|---|---|---|
| Guaranteed write size until EOL | 300 TBW | 600 TBW | 1,200 TBW |
| Losable write size (Meta block condition) | 72 MB | 72 MB | 72 MB |

TABLE 5

BiCS5 512 Gb NAND

| Capacity | 1TB | 2TB | 4TB |
|---|---|---|---|
| Guaranteed write size until EOL | 600 TBW | 1,200 TBW | 2,400 TBW |
| Losable write size (Meta block condition) | 84 MB | 84 MB | 84 MB |
| Losable write size Maximum size due to PRE ERASE) | 252 MB | 252 MB | 252 MB |

Since this combination of developments may affect the lifespan and reliability of NAND flash memory, including different PEC values for different block types, different hSLC/TLC PEC ratios per generation of NAND flash memory, increasing block sizes per block type and plane, and decreasing block counts per die, it has become of great significance to prevent unnecessary PEC increases in high-scalable N-level Cell (XLC) 3D NAND technology. For example, preventing unnecessary erase operations in the MLC block pool, such as during UGSD recovery, may be of primary importance for extending the lifespan of the SSD. While ungraceful shutdowns (UGSD) may be rare events in real (non-testing) environments, it is impossible to predict user behavior and the conditions under which an SSD is used, and therefore increasing tolerability of this core functionality by preventing unnecessary PEC increases during UGSD recovery may lead to increased SSD product reliability.

However, current approaches to handle the XLC block pool which include hybrid SLC block conditions may not identify the erased block type after UGSD or during UGSD recovery for the hSLC allocated or pre-erase allocated blocks. As a result, the controller FW may end up triggering unnecessary flash fill and erase operations from the MLC block pool to prevent the possibility of using different block types during erase and program operations. Though these approaches may prevent unrecoverable data from arising during UGSD recovery, inefficiently incrementing the PEC of the block in this manner may significantly impact the durability of the SSD, where using high scale N-level cell NAND (e.g., QLC, penta-level cell (PLC), and so on) typically have low guaranteed PEC cycles.

To address such inefficiency, an erase type detection mechanism is provided which allows the controller of the storage device to identify erase block types that may be lost during UGSD, power reset events, or other unexpected firmware behavior events. By detecting the proper erase block type prior to the UGSD or similarly unexpected power reset event, the controller may avoid performing a flash fill and subsequent erase operation during UGSD recovery to ensure a same block type is being used for subsequent program operations of host data, thereby preventing unnecessary increments or increases in the PEC of the block. The controller may employ this mechanism in various SSD architectures, such as an SSD architecture that uses fixed block counts for each block type pool (e.g., SLC block pools, MLC block pools, etc.) and employs a MLC block pool for hybrid block type usage, or an SSD architecture that uses non-fixed block counts per block type pool or uses the same block pool for multiple block types instead of a fixed block type pool. The erase type detection mechanism may be implemented with low complexity in the controller, may increase the lifecycle of the storage device by removing or mitigating unnecessary erase operations during a UGSD recovery, and may ultimately enhance the overall performance and durability of the SSD. The erase type detection mechanism may also be employed in controller FW operations in lieu of saving erase block types in memory, for example without requiring the controller to store the erase block type during a control sync, thereby reducing the amount of memory space utilized for erase block type information and further contributing to the optimization and efficiency of SSDs.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include one or more non-volatile memories (NVMs) 110 for persistent storage of data received from the host 104. The NVM(s) 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, N-level cell (XLC) memory, or any combination thereof), or NOR memory. The NVM(s) 110 may include a plurality of NVM memory locations 112 which may store system data for operating the storage device 102 or user data received from the host for storage in the storage device 102. For example, the NVM may have a cross-point architecture including a 2-D NAND array of NVM memory locations 112 having n rows and m columns, where m and n are predefined according to the size of the NVM. In the exemplary embodiment of FIG. 1, each NVM memory location 112 may be a die 114 including multiple planes each including multiple blocks of multiple cells 116. Alternatively, each NVM memory location 112 may be a plane including multiple blocks of the cells 116. The cells 116 may be single-level cells, multi-level cells, triple-level cells, quad-level cells, penta-level cells and/or N-level cells, for example. Other examples of NVM memory locations 112 are possible; for instance, each NVM memory location may be a block or group of blocks. Each NVM memory location may include one or more blocks in a 3-D NAND array. Each NVM memory location 112 may include one or more logical blocks which are mapped to one or more physical blocks. Alternatively, the memory and each NVM memory location may be implemented in other ways known to those skilled in the art.

The storage device 102 also includes one or more volatile memories 117, 118 that can, for example, include a Dynamic Random Access Memory (DRAM) or a Static Random Access Memory (SRAM). For example, as illustrated in FIG. 1, volatile memory 117 may be an SRAM internal to (or integrated into) controller(s) 123 of the storage device 102, while volatile memory 118 may be a DRAM external to (or remote from) controller(s) 123 of the storage device 102. However, in other examples, volatile memory 117 may be a DRAM external to controller(s) 123 and volatile memory 118 may be an SRAM internal to controller(s) 123, volatile memory 117, 118 may both be internal to controller(s) 123 or both be external to controller(s) 123, or alternatively, storage device 102 may include only one of volatile memory 117, 118. Data stored in volatile memory 117, 118 can include data read from the NVM 110 or data to be written to the NVM 110. In this regard, the volatile memory 117, 118 can include a write buffer or a read buffer for temporarily storing data.

The one or more memories (e.g. NVM(s) 110) are each configured to store data 119 received from the host device 104. The data 119 may be stored in the cells 116 of any of the NVM memory locations 112. As an example, FIG. 1 illustrates data 119 being stored in different NVM memory locations 112, although the data may be stored in the same NVM memory location. In another example, the NVM memory locations 112 may be different dies, and the data may be stored in one or more of the different dies.

Each of the data 119 may be associated with a logical address. For example, the volatile memory 118 may store a logical-to-physical (L2P) mapping table 120 for the storage device 102 associating each data 119 with a logical address. The L2P mapping table 120 stores the mapping of logical addresses specified for data written from the host 104 to physical addresses in the NVM(s) 110 indicating the location(s) where each of the data is stored. This mapping may be performed by the controller 123 of the storage device. The L2P mapping table may be a table or other data structure which includes an identifier such as a physical address associated with each memory location 112 in the NVM(s) where data is stored. While FIG. 1 illustrates a single L2P mapping table 120 stored in volatile memory 118, in other examples, the L2P mapping table 120 may include multiple tables stored in volatile memory 118. Mappings may be updated in the L2P mapping table 120 respectively in response to host writes, and periodically the L2P mapping table 120 may be flushed from volatile memory 118 to one or more of the NVM memory locations 112 of NVM(s) 110 so that the mappings may persist across power cycles. In the event of a power failure in storage device 102, the L2P mapping table 120 in volatile memory 118 may be recovered during initialization from the L2P entries previously stored in NVM(s) 110.

Figure 2:
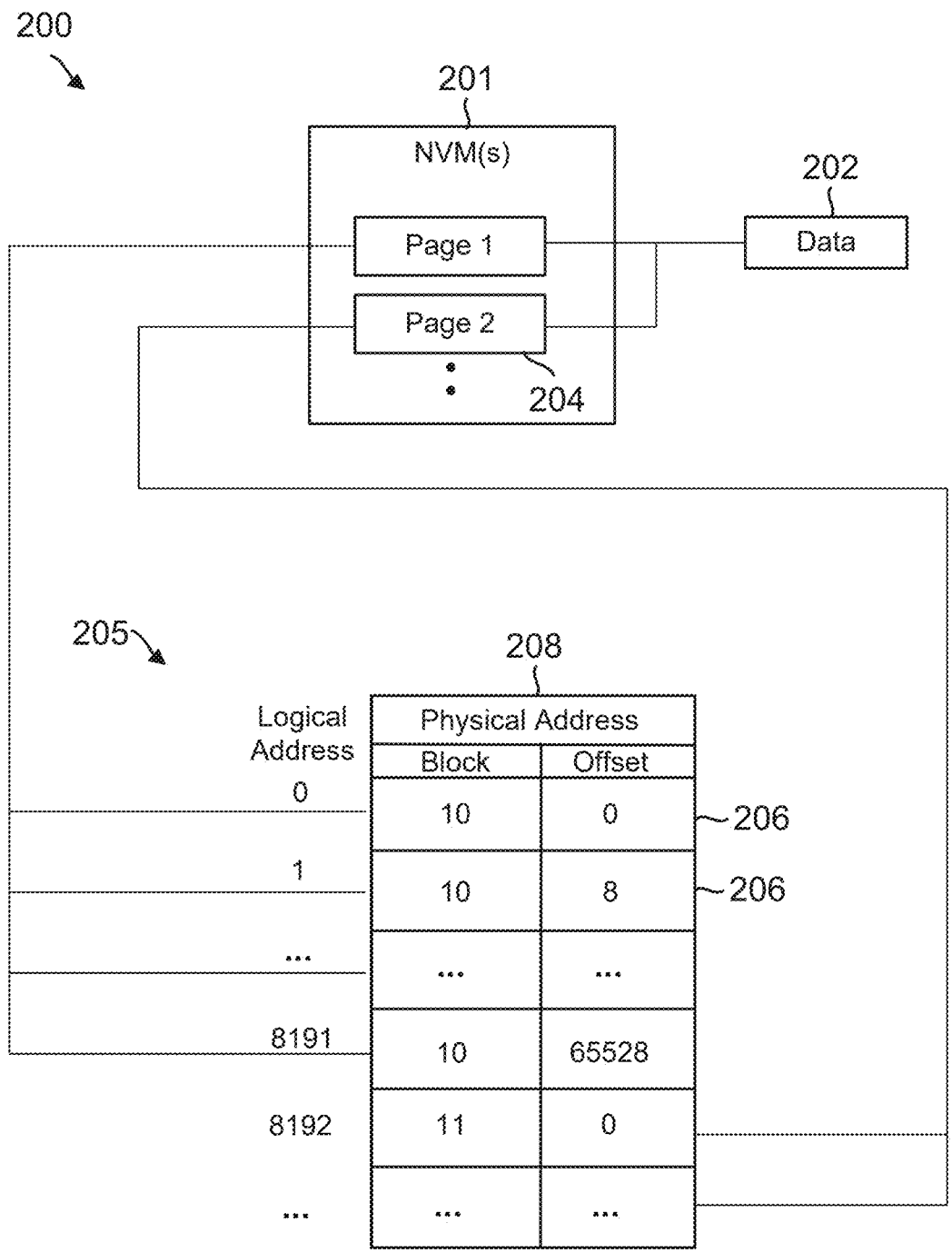
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 stored in volatile memory (e.g., the volatile memory 118 of FIG. 1) illustrating the mapping of data 202 received from a host device to logical addresses and physical addresses in NVM(s) 201 (e.g., the NVM(s) 110 of FIG. 1). The data 202 may correspond to the data 119 in FIG. 1, while the L2P mapping table 205 may correspond to the L2P mapping table 120 in FIG. 1. In one example, the data 202 may be stored in one or more pages 204 (e.g., physical pages) in NVM(s) 201. Each page 204 may be associated with a mapping set including one or more entries 206 of the L2P mapping table 205 respectively identifying a physical address 208 mapped to a logical address (e.g., a logical block address (LBA)) associated with the data written to the NVM(s). A logical page may include one or more of the entries 206. An LBA may be a logical address specified in a write command for the data received from the host device. Physical address 208 may indicate the block and the offset at which the data associated with an LBA is physically written, as well as a length or size of the written data (e.g. 4 KB or some other size). In the illustrated example, page 204 encompassing 32 KB of data 202 may be associated with a mapping set including 8192, 4 KB entries. However, in other examples, page 204 may encompass a different amount of host data (e.g. other than 32 KB of host data) or may include a different number of entries 206 (e.g., other than 8192 entries), or entries 206 may respectively include different host data lengths (e.g., other than 4 KB each).

Referring back to FIG. 1, the NVM(s) 110 include sense amplifiers 124 and data latches 126 connected to each NVM memory location 112. For example, the NVM memory location 112 may be a block including cells 116 on multiple bit lines, and the NVM(s) 110 may include a sense amplifier 124 on each bit line. Moreover, one or more data latches 126 may be connected to the bit lines and/or sense amplifiers. The data latches may be, for example, shift registers. When data is read from the cells 116 of the NVM memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller(s) 123, after which the data is stored in the volatile memory 118 until it is transferred to the host device 104. When data is written to the cells 116 of the NVM memory location 112, the controller(s) 123 store the programmed data in the data latches 126, and the data is subsequently transferred from the data latches 126 to the cells 116.

The storage device 102 includes one or more controllers 123 which each includes circuitry such as one or more processors for executing instructions and can each include a microcontroller, a Digital Signal Processor (DSP), an Application-Specific Integrated Circuit (ASIC), a system on a chip (SoC), a Field Programmable Gate Array (FPGA), hard-wired logic, analog circuitry and/or a combination thereof. The one or more controllers 123 in the storage device 102 may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

The controller(s) 123 are configured individually or in combination to receive data transferred from one or more of the cells 116 of the various NVM memory locations 112 in response to a read command. For example, the controller(s) 123 may read the data 119 by activating the sense amplifiers 124 to sense the data from cells 116 into data latches 126, and the controller(s) 123 may receive the data from the data latches 126. The controller(s) 123 are also configured individually or in combination to program data into one or more of the cells 116 in response to a write command. For example, the controller(s) 123 may write the data 119 by sending data to the data latches 126 to be programmed into the cells 116. The controller(s) 123 are further configured individually or in combination to access the L2P mapping table 120 in the volatile memory 118 when reading or writing data to the cells 116. For example, the controller(s) 123 may receive logical-to-physical address mappings from the volatile memory 118 in response to read or write commands from the host device 104, identify the physical addresses mapped to the logical addresses identified in the commands (e.g. translate the logical addresses into physical addresses), and access or store data in the cells 116 located at the mapped physical addresses. The controller(s) 123 are also configured individually or in combination to access the L2P mapping table 120 in the NVM(s) 110, for example, following a power failure during initialization, to recover or populate the L2P mapping table 120 in the volatile memory 118.

The aforementioned functions and other functions of the controller(s) 123 described throughout this disclosure may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, combinations of the aforementioned types of computer-readable media, or any other medium that can be used to store computer executable code in the form of instructions or data structures that can be accessed by a computer. Thus, software for implementing each of the aforementioned functions and components may be stored in computer-readable media such as the NVM(s) 110 or volatile memories 117, 118, or otherwise in a memory internal to or external to the storage device 102 or host device 104, and may be accessed by each controller(s) 123 for execution of software by the one or more processors of each controller(s) 123 individually or in combination. Alternatively, the functions and components of the controller(s) may be implemented with hardware in the controller(s) 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller(s) allocate a NVM memory location 112 in the NVM(s) 110 of storage device 102 for storing the data. The controller(s) 123 store the L2P mapping in the L2P mapping table 120 to map a logical address associated with the data to the physical address of the NVM memory location 112 allocated for the data. The controller(s) 123 then store the data in the NVM memory location 112 by sending it to one or more data latches 126 connected to the allocated NVM memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller(s) 123 access the L2P mapping in the L2P mapping table 120 to translate the logical addresses specified in the read command to the physical addresses indicating the location of the data. The controller(s) 123 then read the requested data from the NVM memory location 112 specified by the physical addresses by sensing the data using the sense amplifiers 124 and storing them in data latches 126 until the read data is returned to the host 104 via the host interface 106.

Figure 3:
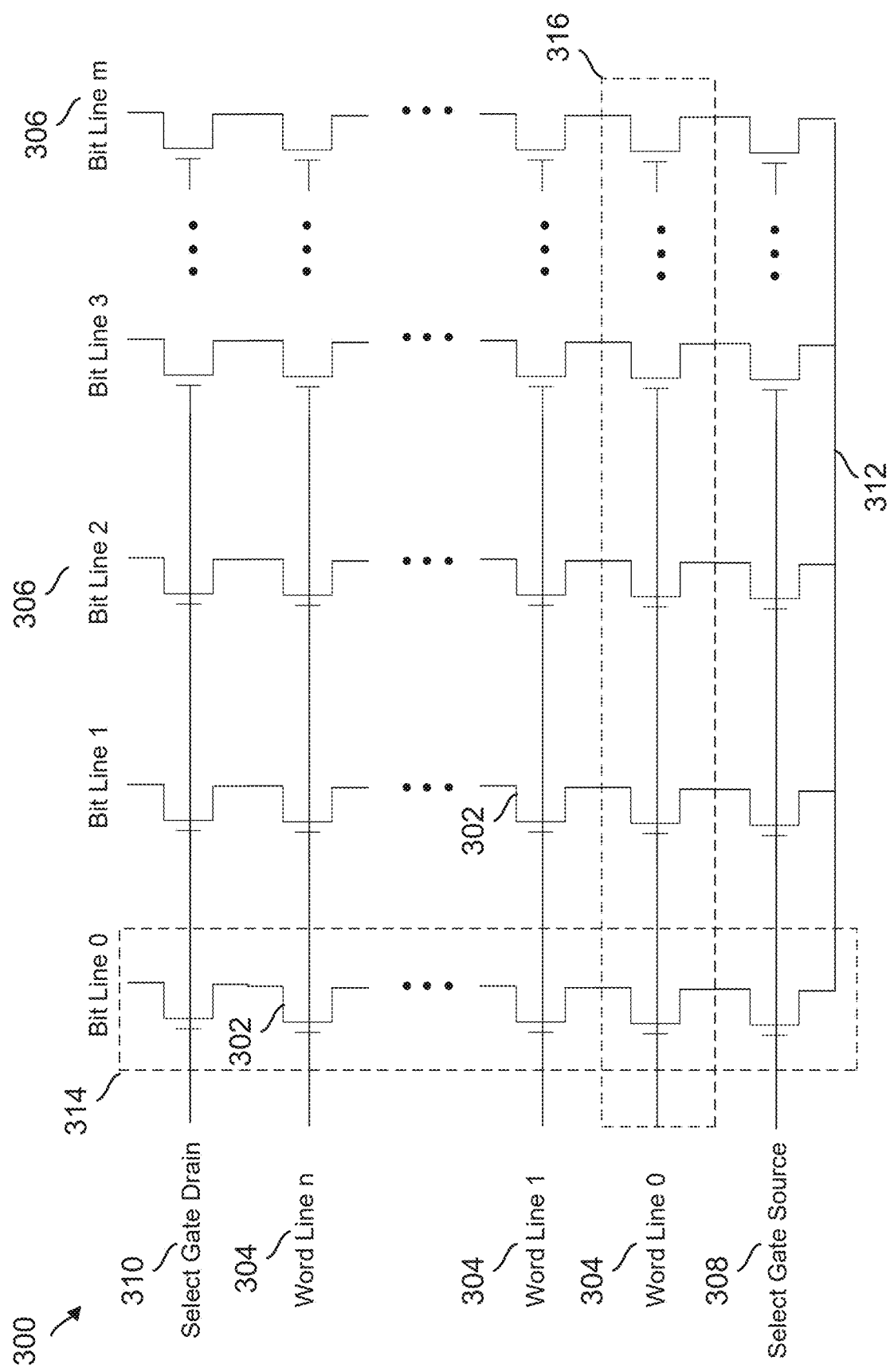
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM(s) 110, 201 of FIGS. 1 and 2. Multiple cells 302 are coupled to word lines 304 and bit lines 306. For example, the memory array 300 may include n word lines and m bit lines within a block of a die 114 of the NVM(s) 110, where n and m are predefined according to the size of the block. Each word line and bit line may be respectively associated with a row and column address, which the controller(s) 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
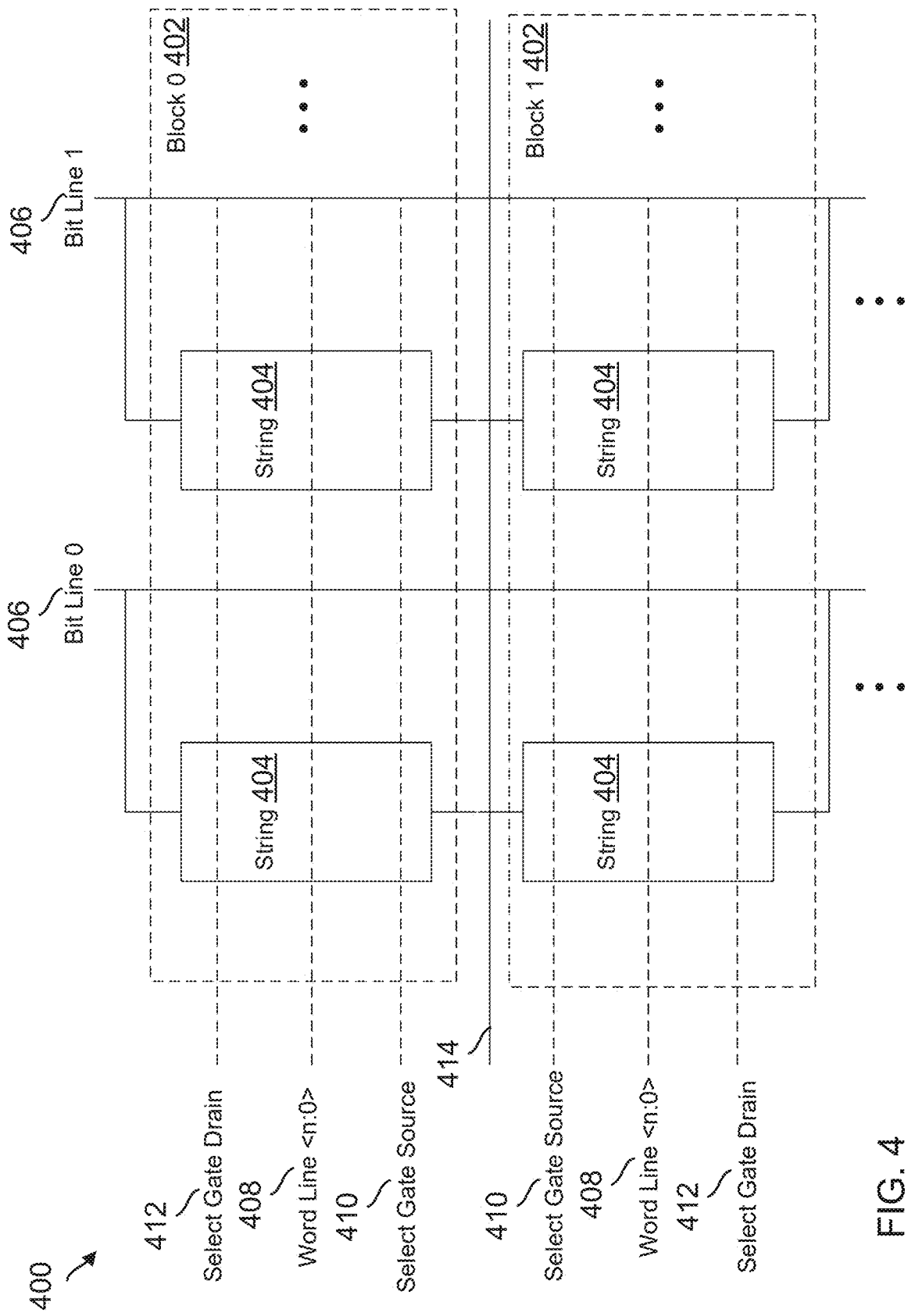
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM(s) 110, 201 of FIGS. 1 and 2, and strings 404 may each correspond to string 314 in FIG. 3. As in the memory array 300 of FIG. 3, each string 404 may include a group of memory cells (e.g., cells 302) each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller(s) 123 read data from or write data to a page 316 of cells 302 (i.e. on a word line 304, 408) in a block 402, the controller(s) may individually or in combination send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller(s) 123 may determine that the cell stores a logic '1', while if the threshold voltage of the cell 302 is larger than the read voltage (i.e. current does not flow through the cell in response the read voltage), the controller(s) 123 may determine that the cell stores a logic '0'. Similarly, during an SLC program operation, the controller(s) may store a logic '0' by sending a command to apply the program voltage to the cell 302 on the word line 304, 408 until the cell reaches the threshold voltage, and during an SLC erase operation, the controller(s) may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller(s) 123 may similarly send commands to apply read or program voltages to the word lines or word line strings to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs in a TLC program operation, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs in a TLC read operation, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell. Finally, when erasing TLCs in a TLC erase operation, the controller(s) may send a command to apply an erase voltage to the block 402 including the cells 302 (e.g., to the substrate of the cells such as the p-well) until all the cells reduce back below their respective threshold voltages, effectively resetting all bits to their initial logic state (e.g., logic '1'). This erase process is similar to that of SLCs, but since TLCs store multiple bits per cell, the erase operation resets the state of all bits within the cell.

Figure 5:
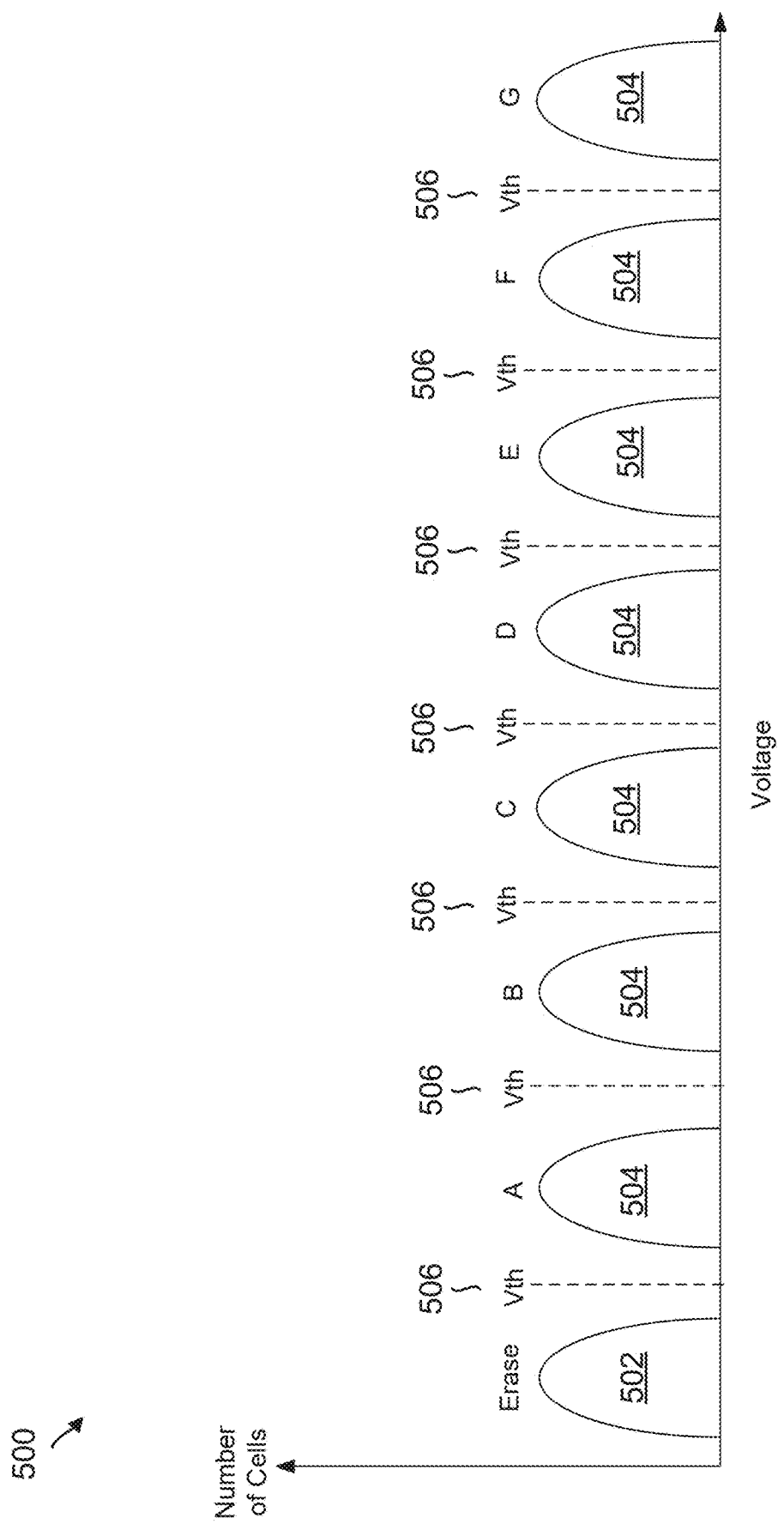
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller(s) 123 erase a block 402 including the cells. When the controller(s) 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6:
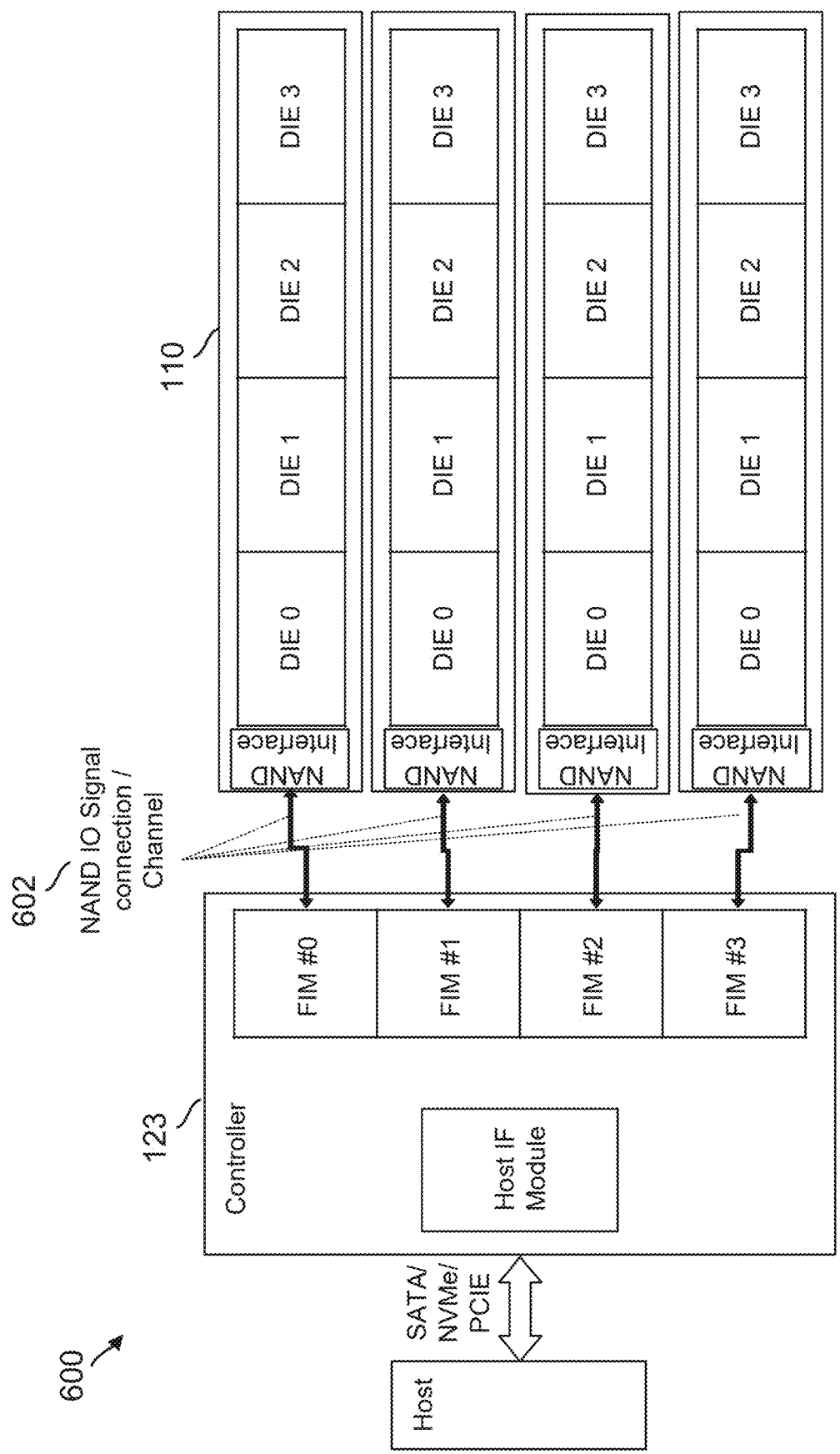
FIG. 6 is a conceptual diagram illustrating an example of an architecture of the storage device of FIG. 1.

FIG. 6 illustrates an example 600 of an SSD architecture. The Flash Interface Module (FIM) and NAND Input/Output (IO) Channel are components in the architecture of SSDs. A FIM serves as an intermediary between the SSD main controller, which may be one example of controller(s) 123, and the NAND flash memory, such as NVM(s) 110, facilitating data transfer and communication. Each FIM is connected to a single NAND input/output (IO) channel or channel 602, which is responsible for managing the flow of data between the FIM and the NAND flash memory. The FIM is capable of controlling single or multiple dies within a NAND package, allowing for efficient management of memory resources and improved performance. In an SSD main controller, there may be multiple FIMs (such as 1, 2, 4, 8, etc.), with the exact number depending on the specific SSD architecture.

Figure 7:
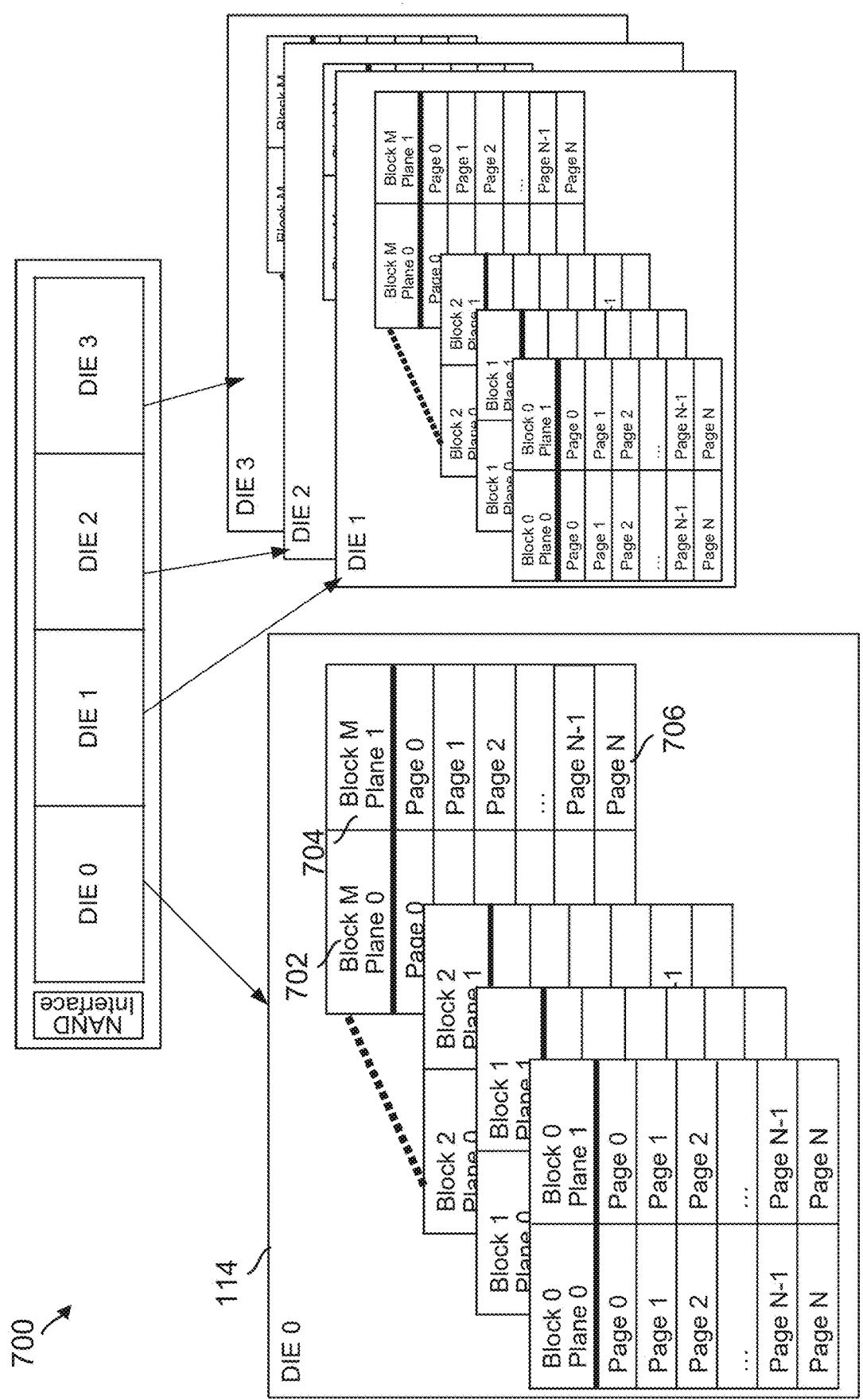
FIG. 7 is a conceptual diagram illustrating an example of a hierarchical structure of NAND flash memory in the storage device of FIG. 1.

FIG. 7 illustrates an example 700 of a hierarchical structure of NAND flash memory. A NAND flash memory may be organized into a hierarchical structure consisting of dies 114, blocks 702, planes 704, and pages 706. A die is the basic unit of a NAND flash memory chip, and it contains multiple blocks within it. Each block is further divided into a number of pages, which are the smallest data storage units in NAND flash memory. A plane is an intermediate level of organization that exists between blocks and dies, allowing for parallel operations and increased performance. In the logical view of NAND flash memory illustrated in FIG. 7, there are N pages per plane, per block out of M blocks, per die.

Figure 8:
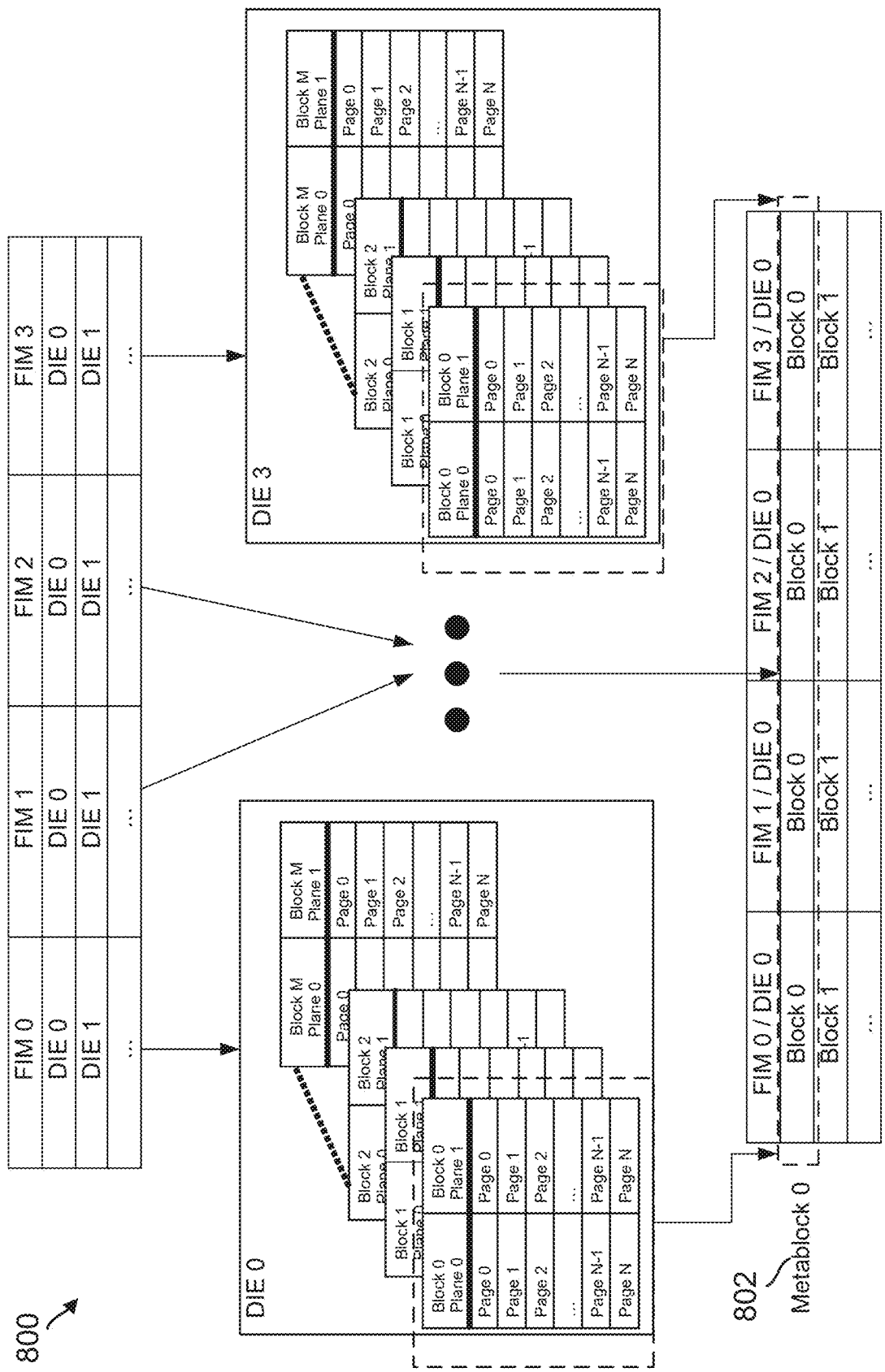
FIG. 8 is a conceptual diagram illustrating an example of relationships of NAND flash memory components in the storage device of FIG. 1.

FIG. 8 illustrates an example 800 of component relationships in NAND flash memory systems. In the illustrated example, a relationship between dies, FIMs, metablocks 802, and blocks are shown for NAND flash memory systems. A die, as previously mentioned, is the basic unit of a NAND flash memory chip, while a FIM serves as an intermediary between the SSD main controller and the NAND flash memory. A metablock is a higher-level organizational structure that contains one block associated with each FIM and plane. This configuration allows for parallel processing and improved performance, as multiple FIMs may access different blocks within the metablock simultaneously. The block number within a metablock is configurable, providing flexibility in the memory organization and management. Furthermore, the number of FIMs associated with a metablock is also configurable; for example, this number may be set to values such as 2, 4, or 8 depending on the specific SSD architecture and performance requirements.

In the context of NAND memory, the controller(s) 123 first erase a NAND block before programming can take place. If the block is not written to until the end of the page within the block, the block is considered to be in an open state, and the controller(s) 123 perform a flash fill operation before erasing the block. Generally, the flash fill operation writes random dummy data to unprogrammed pages in the block using NAND's internal mechanisms, creating a closed block state for the subsequent erase operation. More particularly, the flash fill operation changes the block state to "Fully Written," ensuring that the NAND memory is protected from potential defects. Furthermore, the flash fill operation also sets the block state to "Ready to Erase" on all pages, preparing the memory for the next block erase. This process helps maintain the integrity and functionality of the NAND memory, while mitigating the impact of NAND defects on the memory's performance.

However, if the controller(s) 123 use different block types during erase and program operations without performing a flash fill operation on the erased blocks, such as SLC erases followed by TLC programs of the same block or vice-versa, it may negatively impact the reliability of the SSD. This is because programmed cells may not shift, or may shift too much towards the erased state, due to the application of improper erase voltage by the controller(s) 123 (e.g., an SLC erase voltage on a TLC programmed block, or vice-versa). For example, as shown in Table 6, if the controller(s) 123 issue a TLC program operation to an SLC erased block, an uncorrectable error (UECC) may occur during the read of TLC programmed data. The reverse situation may also yield the same result. In such cases, UECC may not be recovered by Read Error Handling (REH), which means that the host data in the block could be lost.

TABLE 6

Error type from different block type(SLC and TLC) usage case

| Erased Type | Data Written Type | Error Type |
|---|---|---|
| SLC | TLC | UECC, Unrecoverable whole block |
| TLC | SLC | UECC, Unrecoverable whole block |

To prevent different block types from being applied during erase and program operations, the controller(s) 123 generally perform a control synchronization (control sync) operation to store control data in specific blocks, including block type information such as whether the block is an SLC block or TLC block. Control sync is a technique used by the Flash Translation Layer (FTL) to save block type information along with the address mapping table. This process ensures that the memory system can efficiently manage and access stored data. The address mapping table information is stored in one or more specific pages, and after a power cycle, the control synchronization information is read to synchronize the latest information in the SSD. Thus, the control sync allows for the restoration of SSD operating information after a power reset.

However, there may be instances of UGSD or power reset/off events that occur before the completion of the control sync process. Moreover, in the time period between the control sync and UGSD, various operations such as erase, host write, or relocation may take place. These events can lead to data mismatches between the control information from the latest control sync and the actual memory situation at the block or page level.

Generally, if the control sync operation is not completed or initiated before the power is turned off, such as in the event of a UGSD, the controller(s) 123 rebuild the control data with block type information after bootup via a UGSD recovery operation. Moreover, to address data mismatches, the controller(s) implement recovery flows for different scenarios. For erase blocks, the flash fill process is employed, which involves putting dummy data into the remainder of the block as previously described, allowing it to be erased and rewritten as either SLC or MLC. For host write or relocation operations, the controller(s) use a Find the Last Good Page (FLGP) process and relocation for valid data on write aborted blocks to ensure data integrity. If the host data is written properly in the first page of each block, the controller(s) can recognize the page written type and handle it accordingly.

Such UGSD recovery operations were generally effective in earlier SSD architectures, where a fixed block allocation was designated for both Single-Level Cell (SLC) and Multi-Level Cell (MLC, TLC, QLC, and N-Level Cell) block types, and the controller would store host data in both SLC and MLC block pools. However, since SLC block type program and erase operations are faster than those of MLC block types, hSLC technology was consequently developed in current SSD architectures to improve write performance in memory systems allows the use of TLC blocks, QLC blocks, or other types of MLC/XLC block partitions.

Figure 9:
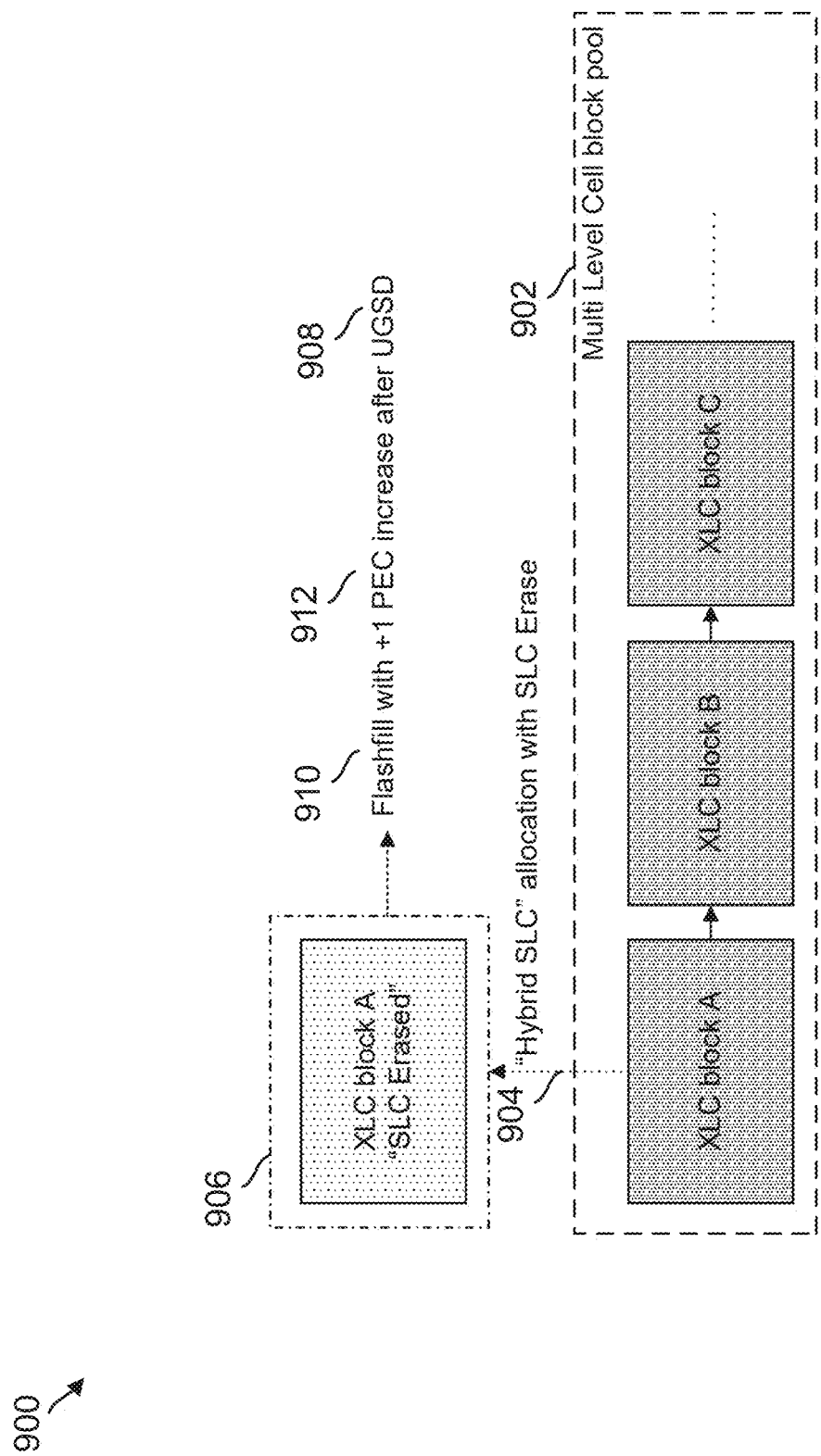
FIG. 9 is a conceptual diagram illustrating an example of a hybrid single-level cell (SLC) allocation in the storage device of FIG. 1.

FIG. 9 illustrates an example 900 of a hybrid SLC allocation, which allows for the conversion of a single MLC block into an SLC block type when such allocation is desirable. hSLC technology allows the controller(s) 123 to temporarily utilize MLC blocks as SLC block types. By enabling the erasure of MLC blocks as SLC block types and writing data with SLC block types, hSLC technology enhances the overall performance and efficiency of the memory system. In this example, controller(s) 123 may erase an MLC block for use as an hSLC block, thereby achieving enhanced host write performance. For instance, XLC blocks 902 in a MLC blook pool may be allocated at 904 as hybrid SLC blocks 906 via an SLC erase.

Additionally, a pre-erase feature was later introduced in current SSD architectures to further optimize the benefits of hybrid SLCs. Pre-erase allows the controller(s) 123, while in an idle mode (not processing a host command), to increase the number of blocks to be erased as SLC block types from a MLC block pool. This feature enhances the efficiency of data storage and retrieval, as well as the overall performance of the NAND memory system, by allowing the controller(s) to pre-erase a group of MLC blocks at once and set them as SLC blocks for future use by the host (or vice-versa) in a faster manner than individual block erasures.

Figure 10:
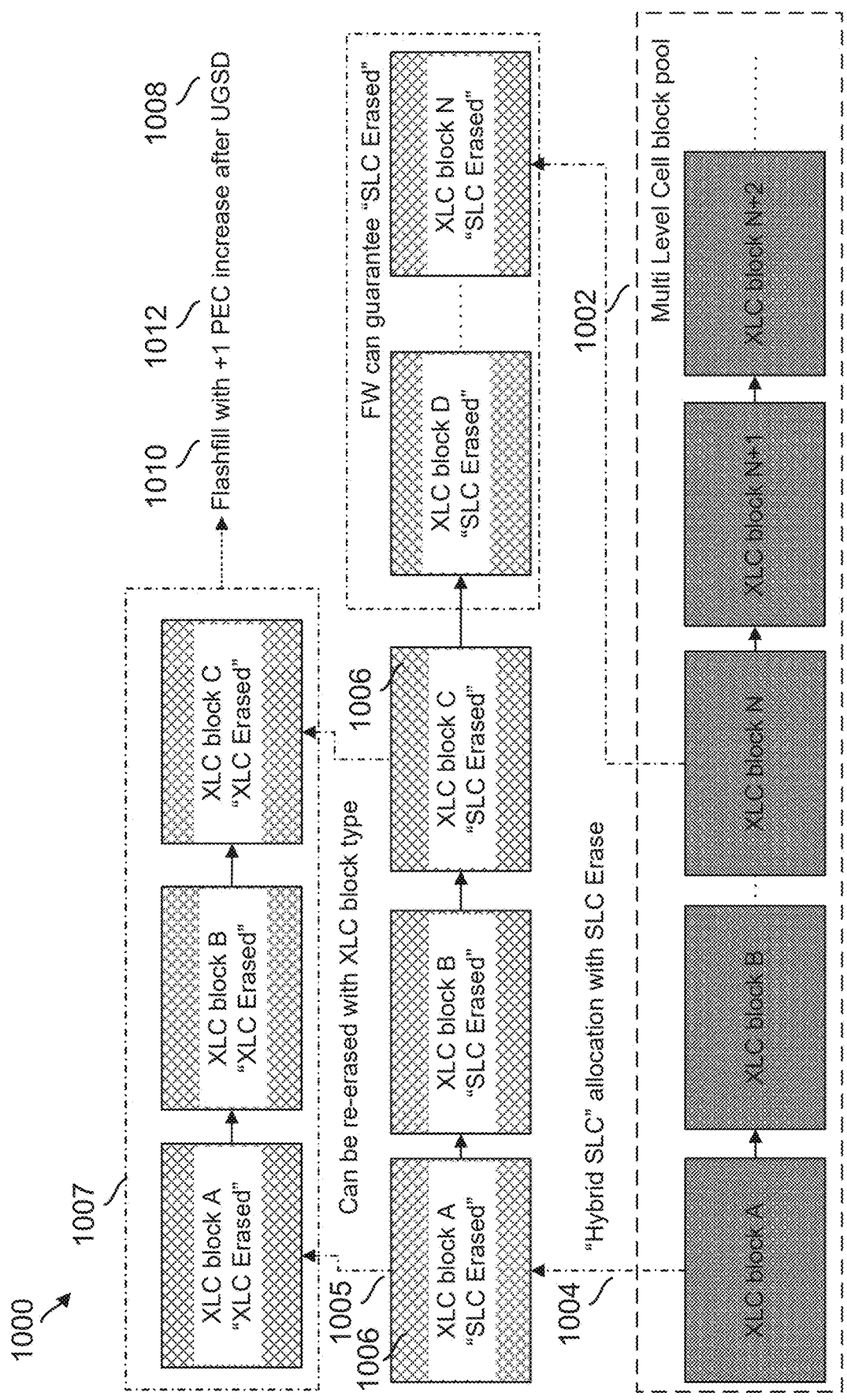
FIG. 10 is a conceptual diagram illustrating an example of a hybrid SLC allocation based on a pre-erase condition in the storage device of FIG. 1.

FIG. 10 illustrates an example 1000 of a hybrid SLC allocation based on a pre-erase condition, which allows erasing multiple MLC blocks as SLC block types when the controller(s) 123 are idle. In this scenario, when the controller(s) 123 perform a pre-erase, the controller(s) may quickly allocate multiple hSLC blocks in a MLC block partition prior to executing host commands on this block partition. For instance, XLC blocks 1002 in an MLC block pool may be allocated at 1004 as hybrid SLC blocks 1006 using an SLC erase during pre-erase. Similarly, the controller(s) may pre-erase a hSLC-allocated block as a MLC block type when no MLC blocks are available. For instance, hybrid SLC blocks 1006 may be re-erased at 1005 as XLC blocks 1007 using an XLC erase during pre-erase. Such allocation processes allow for more efficient data storage and retrieval, as well as improved performance in the NAND memory system, since the controller(s) may pre-erase a group of MLC blocks at once and set them as SLC blocks for future use by the host (or vice-versa). The controller(s) may also perform the control sync periodically during a pre-erase block allocation.

In current SSD architectures applying such hybrid SLC or pre-erase features, the controller(s) perform a control sync and handle recovery after unpredictable UGSD events, similar to that performed in earlier fixed block allocation architectures. For example, the flash translation layer of the controller may check the latest status of target blocks, which could be erased or programmed, to synchronize with the latest control data after bootup. However, in response to a UGSD occurring prior to completion of a control sync, there may be erased blocks that were not saved as 'erased' in the memory as control data. Moreover, if an erased block is in the MLC block pool, there is a possibility of this erased block being an SLC erased block due to the hSLC feature or due to the pre-erase feature, with the controller(s) being uninformed of the MLC block actually being an hSLC block due to the failed control sync. For instance, in the example of FIG. 10, even if the controller(s) pass the control sync for XLC blocks D through N and are thus able to guarantee those blocks' status as SLC erased blocks, controller(s) 123 may fail the control sync for XLC blocks A, B, and C and thus not be able to guarantee those blocks' status as SLC erased blocks following UGSD. Thus, if a power reset occurs before the control sync completes, there may be a mismatch between the control synced block type and the actual block type being used due to the hybrid SLC or pre-erase functionality.

Figure 11:
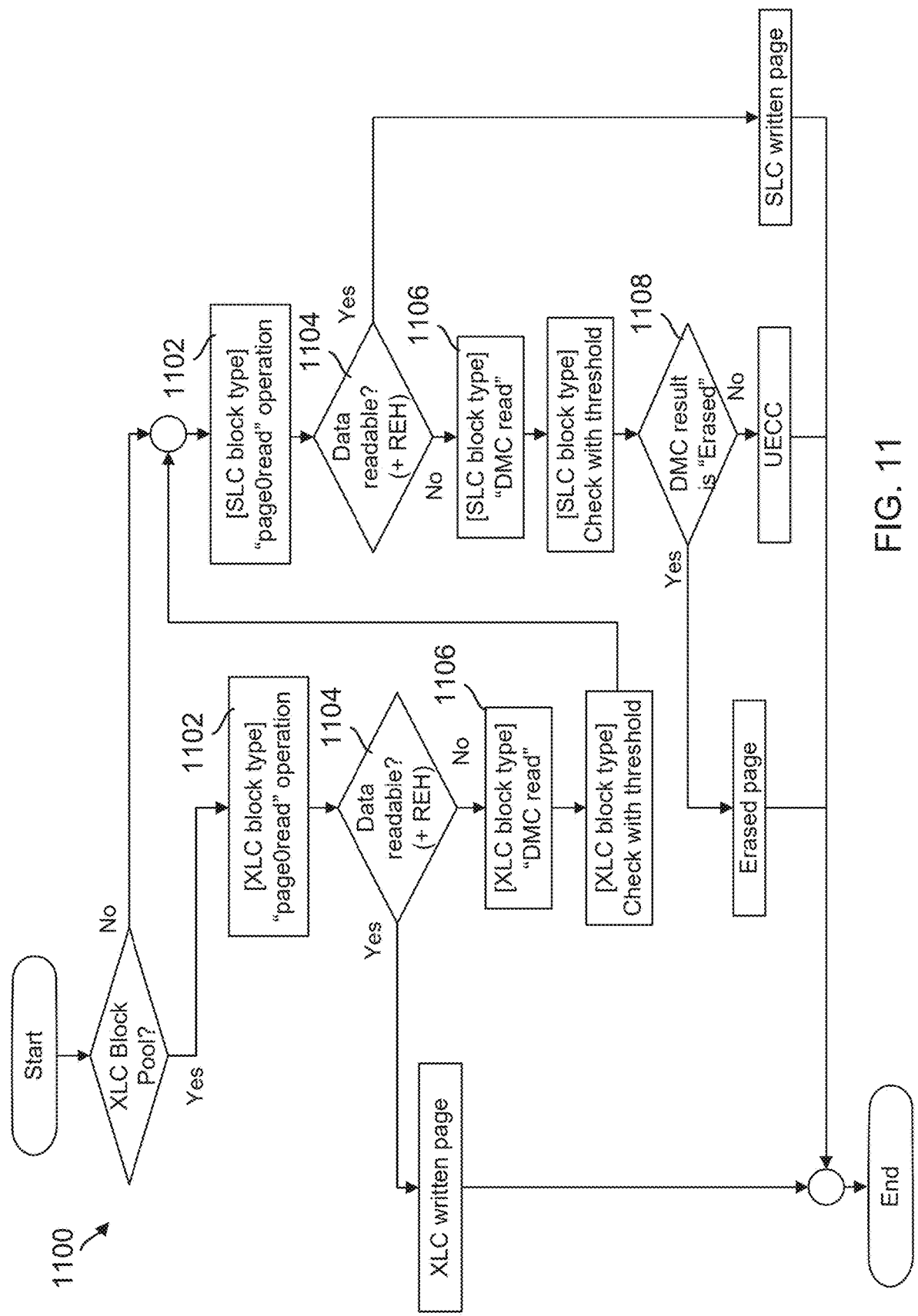
FIG. 11 is a flow chart illustrating an example of an ungraceful shutdown (UGSD) recovery process in hybrid SLC and pre-erase scenarios without erase type detection in the storage device of FIG. 1.

FIG. 11 illustrates an example 1100 of a UGSD recovery process in hybrid SLC and pre-erase scenarios. In the event of a UGSD immediately after erasing a specific MLC block as an SLC block type, the controller(s) may inspect potential SLC erased blocks within an un-erased block list during the UGSD recovery process, starting with the specific MLC block that was erased. For example, when performing a UGSD recovery operation for a hybrid SLC block, the firmware triggers an initial page read ("page0read") operation at blocks 1102 of both SLC and MLC block types for every block in the MLC block pool, which could be erased or programmed before the UGSD. The "page0read" operation reads page 0 (the initial page) in the target block for each block type and may recognize the programmed data type if the data was written correctly before the UGSD. If the "page0read" operation cannot read data until REH is completed at blocks 1104, the firmware performs a direct memory count (DMC) read operation ("DMC read") to obtain bit counts at blocks 1106, which show un-erased cell count information from both SLC and MLC block types. For example, the operation may involve counting the number of '0' bits in a 4 KB flash management unit (FMU) or page. The controller(s) may determine at block 1108 whether a block is erased by comparing the bit counts with a threshold value in a memory read performance histogram (MRPH) for each block type.

However, while the controller(s) may determine in the example 1100 whether a block is erased or not following UGSD recovery, there is no current mechanism for the controller(s) to check the erased block type between the last control synchronization and the UGSD. For example, the controller(s) may not currently ascertain during UGSD recovery whether the erased block type in the MLC block partition was originally a hybrid SLC or a MLC prior to the UGSD. Thus, since the controller(s) are unable to determine the erased block type prior to the UGSD within the MLC block pool after completing the UGSD recovery operation, the block erased type information is lost during the UGSD process. As a result, the controller(s) carry out a flash fill and erase operation on the potentially hSLC or MLC block to prevent unexpected errors that could not be handled during the recovery process.

Figure 12:
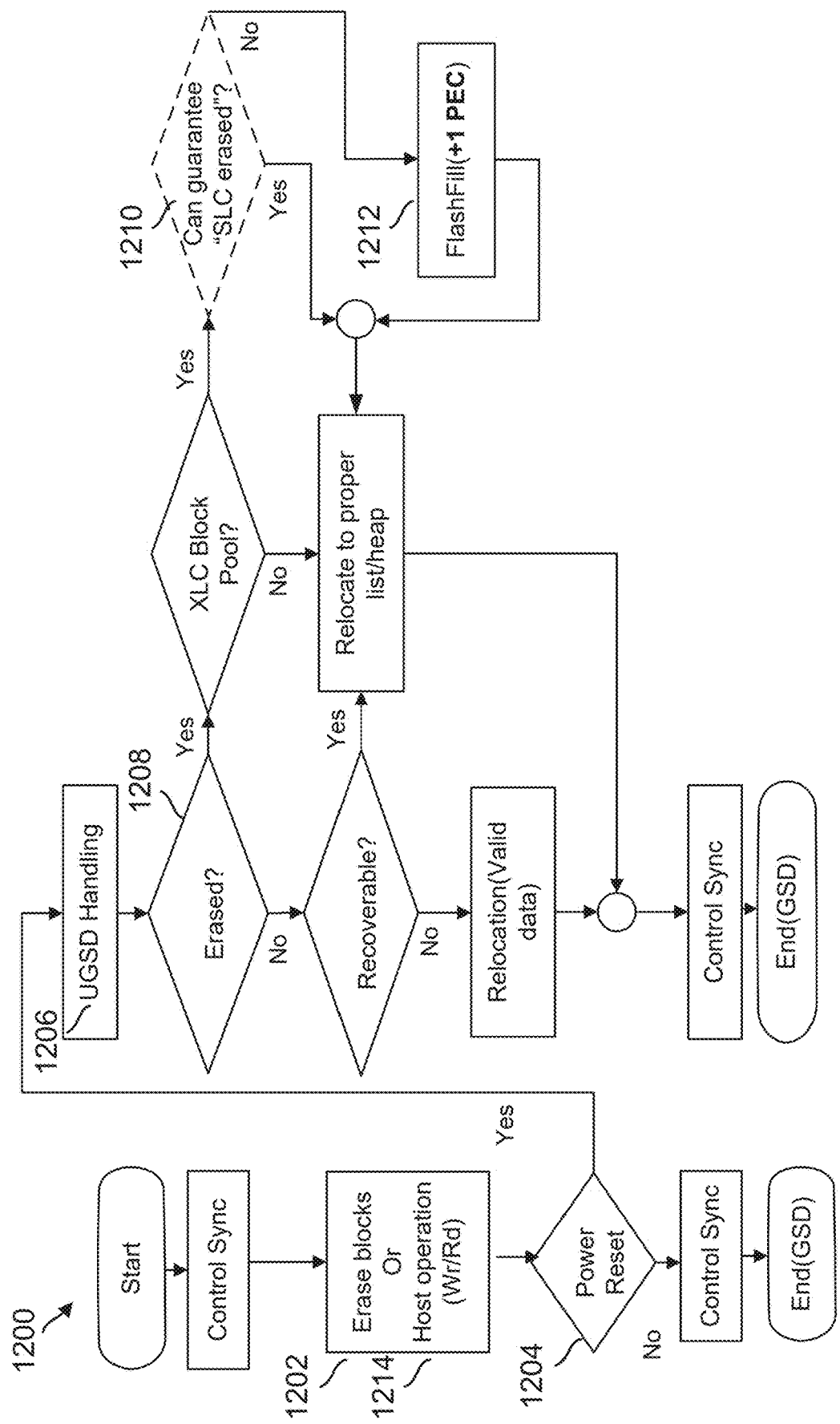
FIG. 12 is a flow chart illustrating an example of an overall UGSD handling process in hybrid SLC and pre-erase scenarios without erase type detection in the storage device of FIG. 1.

FIG. 12 illustrates an example 1200 of an overall UGSD handling process in hybrid SLC and pre-erase scenarios. For example, in a hybrid SLC scenario, after allocating one XLC block as SLC erased via an SLC erase operation at block 1202, failing to complete a control sync prior to a power loss event such as a UGSD at block 1204, and running through the UGSD recovery process of FIG. 11 at block 1206, the controller(s) may determine that this XLC block was erased at block 1208, but not whether this XLC block was erased prior to the UGSD as an XLC (e.g., an MLC) or an SLC (e.g., a hybrid SLC) at block 1210. For instance, referring to FIG. 9, the controller(s) may not be able to ascertain whether the XLC block being considered following UGSD 908 is XLC block 902 or hSLC block 906. Similarly, in a pre-erase scenario, due to the characteristics of the pre-erase feature allowing multiple hybrid SLC blocks to be re-erased as MLC blocks, there may be multiple blocks for which the controller(s) may not be able to identify the erased block type after UGSD at block 1210. For instance, referring to FIG. 10, the controller(s) may not be able to ascertain whether the XLC blocks being considered following UGSD 1008 are hybrid SLC blocks 1006 or XLC blocks 1007. Therefore, during UGSD recovery at block 1212, the controller(s) perform a flash fill operation 910, 1010 on the XLC block 906, 1007 (or possible MLC block) and perform an erase operation 912, 1012 on XLC block 906, 1007 (or possible MLC block), inefficiently increasing the block's PEC, to prevent unexpected errors from the possibility of a subsequent program operation 1214 using a different block type than that used for the earlier erase operation (such as when the process in example 1200 begins again).

While this process of example 1200 may improve data retention of the block by guaranteeing the controller(s) will use the same block type to erase and program the block, this process increases the number of program erase cycles of the block and may have an especially significant and undesirable impact for storage devices of newer NAND generations. For example, if the controller(s) originally performed an hSLC erase operation on an hSLC block prior to the UGSD such as at 904 and 1004, thereby incurring one PEC, but then after the UGSD 908, 1008, the controller(s) performs the flash fill 910, 1010 and subsequent hSLC erase operation 912, 1012 on the block following UGSD recovery at block 1212, a total increment of two PECs may be inefficiently applied to the block. As this unnecessary extra PEC cycle occurs as a result of the controller(s)' inability to ascertain the hSLC block type during UGSD recovery, it would be helpful if the controller(s) were able to detect the erased block type after an unexpected power reset or otherwise determine the erase block type during unexpected conditions. This would prevent such unnecessary erase operations that may significantly impact the lifespan of SSDs, particularly those using high-scalable MLC NAND (e.g., QLC, PLC, and next N-Level Cell).

To this end, the controller(s) 123 of the present disclosure may individually or in combination be configured with an erase type detection mechanism which allows the controller(s) to detect the erase type of erased blocks from a hybrid block type usage pool. The erase type detection mechanism leverages the different internal operation behaviors which the controller(s) may perform for each block type for respective erase operations. For example, the controller(s) may apply different types of erase operations for MLC block partitions and SLC block partitions, namely a deep erase operation when it erases MLCs (e.g., MLC, TLC, QLC, and N-level Cell) and a soft erase operation when it erases SLCs (or hSLCs), and the controller(s) may detect whether an erased block type is MLC or hSLC based on the difference between these operations. For instance, in a deep erase operation, the controller(s) may apply a higher erase voltage level to the memory cells for a longer duration to ensure a more uniform and precise erasure of data of MLCs, while in a soft erase operation, the controller(s) may apply a lower erase voltage level to the memory cells for a shorter duration to provide a faster erase with lower impact on wear of SLCs. This difference in erase operations provides different Cell Voltage Distribution (CVD) results, such as shown in FIGS. 13A-C.

FIGS. 13A-C are examples 1300, 1320, 1340 of CVD charts illustrating different results from SLC and TLC erase operations. While some of these examples specifically refer to TLC blocks or TLC erase operations, it should be understood that the concepts described in these examples are not limited to TLCs but may apply to other types of MLCs or XLCs. The x-axis of the CVD graphs represent a voltage level such as a threshold voltage applied to a cell, while the y-axis represents a bit count 1302, 1322, 1342 of cells for each voltage level. In the SLC block type, each memory cell stores only one bit of information, while in the TLC block type, each memory cell stores three bits of information, allowing for higher storage density. In the example 1300 of FIG. 13A, the CVD illustrates bit counts 1302 of a TLC block partition following a TLC erase of a TLC block (such as an XLC erase of XLC block 902, 1002, 1006), a flash fill operation (such as flash fill operations 910, 1010), and then a subsequent SLC erase operation (such as a soft erase operation in one example of erase operation 912, 1012), thus converting the TLC block to a hSLC. In the example 1320 of FIG. 13B, the CVD illustrates bit counts 1322 of a TLC block partition following a TLC erase of a TLC block (such as an XLC erase of XLC block 902, 1002, 1006), a flash fill operation (such as flash fill operations 910, 1010), and then a subsequent TLC erase operation (such as a hard erase operation in another example of erase operation 912, 1012), thus maintaining the TLC block as a TLC. The example 1340 of FIG. 13C illustrates the difference in CVDs between an erased block of a SLC block type 1344 and an erased block of an MLC block type 1346.

Based on the expected CVD difference between different erased block types such as illustrated in example 1340, the controller(s) may determine the erased block type of a specific block by comparing bit counts obtained from DMC reads of an erased page for each block type. For instance, the controller may apply DMC reads for each block type during the page0read operation in UGSD recovery and determine the block type based on a comparison of the DMC results. If the DMC result from the MLC block type indicates an erased state, the controller(s) may decide that the erased type is a MLC block type. In contrast, if the DMC result from the MLC block type is not suitable, the controller(s) attempt the DMC read as an SLC block type during the page0read operation. If the DMC result from the SLC block type indicates an erased state, the controller(s) may decide that the erased type is an SLC block type.

Figure 14:
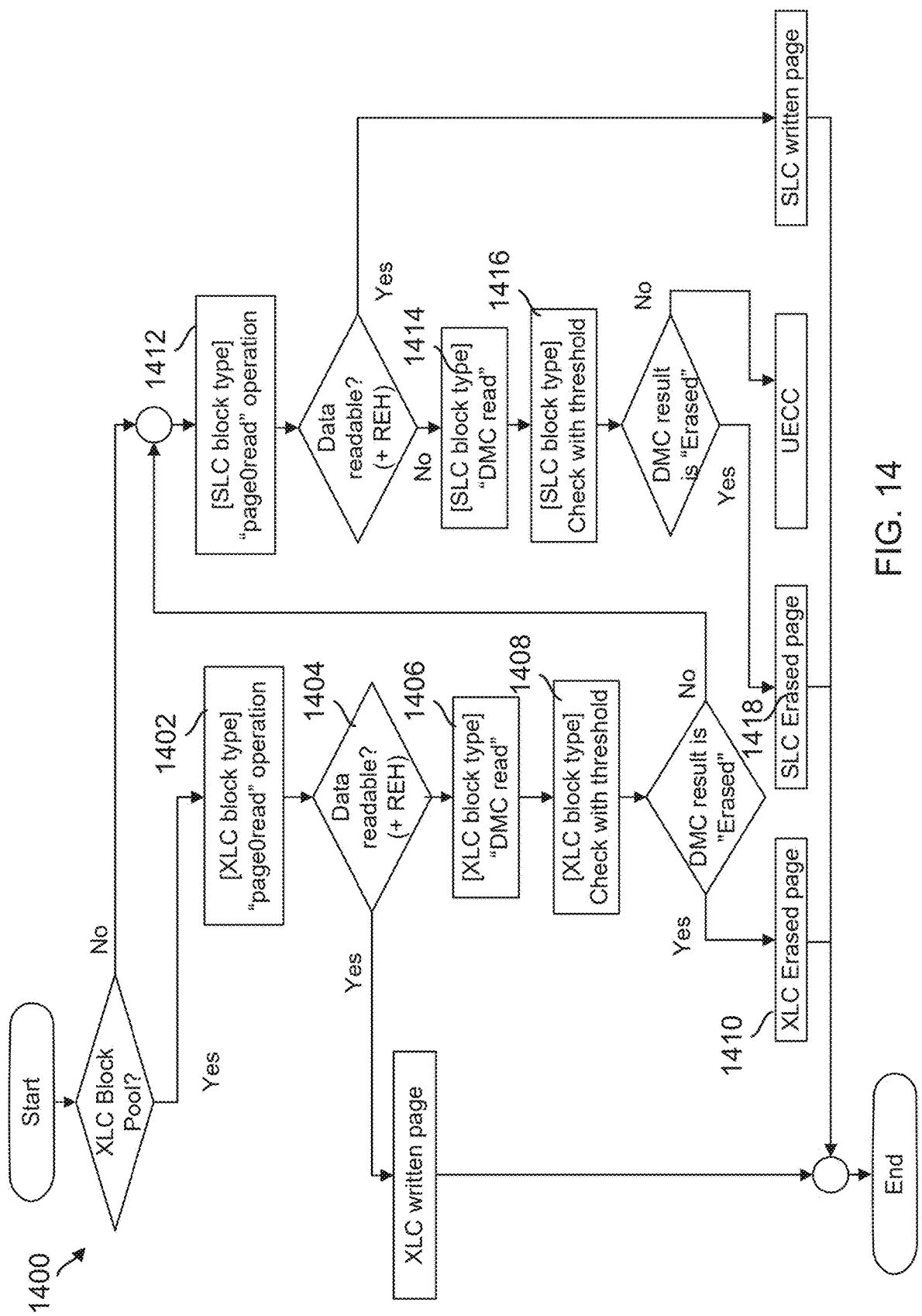
FIG. 14 is a flow chart illustrating an example of a UGSD recovery process including erase type detection for a single block in the storage device of FIG. 1.

FIG. 14 illustrates an example 1400 of an erase type detection mechanism for a single block. During UGSD recovery, if a block targeted for detection is in an XLC pool such as XLC block 902, 1002, 1006, the controller(s) performs a page0read operation at block 1402 in which the controller(s) read page 0 in attempt to determine the erase block type from possibly successfully written data. If the page0read operation cannot read the data until read error handling is completed at block 1404, the controller(s) perform a DMC read operation at block 1406 to obtain the bit count of the XLC block, such as the un-erased cell count for the TLC block type illustrated in example 1320 or for the MLC block type 1346 illustrated in example 1340. The controller(s) compare the bit count value with an XLC threshold at block 1408, and if the threshold is met, the controller(s) determine at block 1410 that the page is an XLC erased page and thus that the block is an XLC erased block. If the threshold is not met, the controller(s) attempt another page0read operation at block 1412 and, if unsuccessful, another DMC read at block 1414 to obtain the bit count of an SLC block type, such as the un-erased cell count for the SLC block type illustrated in example 1300 or for the SLC block type 1344 illustrated in example 1340. The controller(s) compare the bit count value with an SLC threshold at block 1416, and if the threshold is met, the controller(s) determine at block 1418 that the page is an SLC erased page and thus that the block is an SLC erased block. Otherwise, the page is determined to have a UECC. An example of controller decisions at the FIM/plane level based on these DMC results is shown in Table 7, in which the controller(s) may determine whether the previous erased operation or erase block type of a block is SLC or XLC depending on the DMC read results.

TABLE 7

Erase Type Decision based on FIM/Plane level

| Previous erased operation | DMC read result -Multi Level Cell(XLC) block type - | DMC read result -SLC block type- |
|---|---|---|
| SLC | Not erased | Erased |
| XLC | Erased | Erased |

Figure 15:
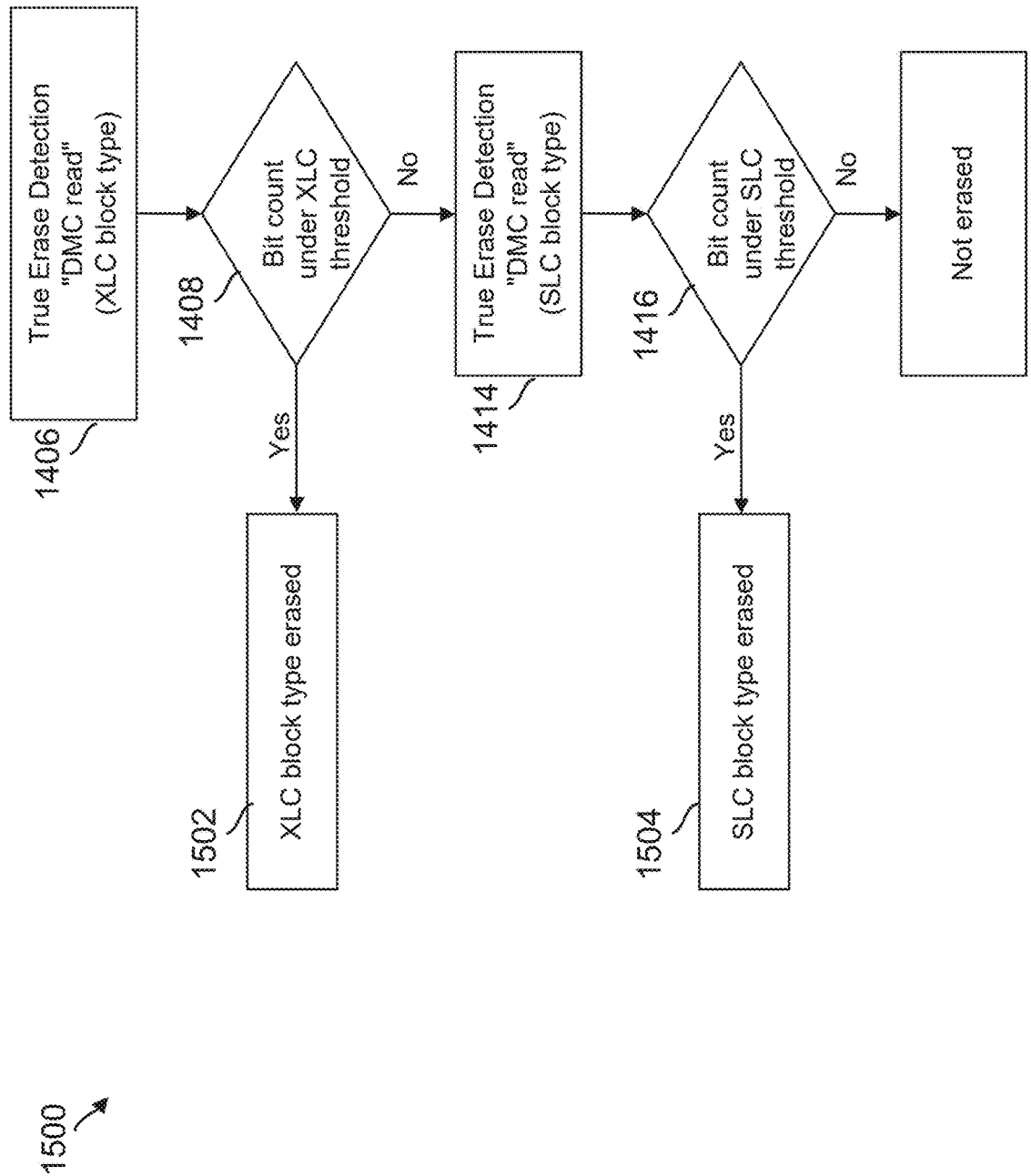
FIG. 15 is a flow chart illustrating an example of erase type detection including direct memory count (DMC) read operations performed for a single block in the storage device of FIG. 1.

FIG. 15 illustrates an example 1500 of the DMC read operations performed at blocks 1406, 1408, 1414, and 1416 of FIG. 14. More particularly, when the controller(s) perform the aforementioned DMC read operations on a target block, the controller(s) determine whether a "true erase" condition or state for each block type is met. For example, the controller(s) may count at blocks 1406 and 1414 the number of '0' bits in an FMU which are at or above a certain voltage level corresponding to an erase state (and thus to un-erased cells) for each block type (SLC and MLC). Afterwards, the controller(s) may compare at blocks 1408 and 1416 different thresholds for each block type against the counted number of bits to verify whether the true erase condition is met for a respective block type. For example, the controller may determine at blocks 1408 and 1416 whether the un-erased cell count is under a specific threshold associated with a given block type, in which case the controller may determine at block 1502 or 1504 that the true erase condition is met for that block type and thus identify the target block to be of that block type.

Thus, in the erase type detection mechanism of FIGS. 14 and 15, the controller(s) may detect an erase block type for a target block in response to determining whether a given threshold associated with that block type, when applied to a determined bit count, result in a true erase condition being met for the target block. For example, in example 1320, the controller(s) may determine a true erase condition is met for a TLC erased block, and thus that a target block is a TLC erased block at block 1502, if the cumulative bit counts of the block which are at or above an example reference voltage of −1.5 V are less than an example threshold of 30 bits associated with the TLC block type (or other quantity corresponding to the reference voltage). Similarly, in example 1300, the controller(s) may determine a true erase condition is met for the SLC erased block, and thus that a target block is a SLC erased block at block 1504, if the cumulative bit counts of the block which are at or above an example reference voltage of 0.5 V are less than an example threshold of 80 bits associated with the SLC block type (or other quantity corresponding to the reference voltage). In these examples, the threshold bit count for a given block type may be the expected bit count of erased cells of that block type corresponding to the reference voltage the controller applies for a DMC read for that block type. Moreover, the thresholds between SLC block types and MLC block types may be different since the MLC erase state is shifted with respect to the SLC erase state due to the different types of erase operations (e.g., hard or soft) applied to different block types, such as illustrated in example 1340. For instance, the threshold used for detecting XLC blocks may generally be lower than the threshold used for detecting SLC blocks due to the distribution of XLC blocks generally being narrower compared to SLC blocks. Thus, the controller(s) may consider the unique characteristics of each block type and their respective erase states by using different threshold values for each block type based on bit counts corresponding to voltages, as well as different reference voltage criteria for each block type, to identify the erase state of a block.

Accordingly, in contrast to UGSD handling schemes such as illustrated and described with respect to FIG. 11, which are focused on simply determining whether the block has been written as XLC or SLC without regard to its erase status other than whether the block is erased or not, the erase type detection mechanism of the present disclosure allows the controller(s) to further identify the erase status of the block prior to UGSD with minimal additional complexity. For instance, the controller(s) may apply at least the page0read and DMC read operations of FIGS. 14 and 15 to detect, following a UGSD, whether a target block (such as one of the XLC blocks in FIG. 9 or 10) is an SLC erased block (such as hSLC block 906, 1006) or a XLC erased block (such as XLC block 902, 1007), without resorting to flash fill 910, 1010 and subsequent erase operations 912, 1012 to avoid block type mismatches and thereby significantly saving PECs. Table 8 below shows the PEC increment difference between these different UGSD handling approaches as a result of the erase type detection mechanism recognizing the erased block type in a single block condition.

TABLE 8

PEC increment difference by "Erase Type Detection Mechanism"

| Previous erased operation | Recognized the erased block type | PEC increment |
|---|---|---|
| SLC | No | +1 |
| XLC | No | +1 |
| SLC | Yes | Always '0' |
| XLC | Yes | Always '0' |

Additionally, the controller(s) may apply this erase type detection mechanism to improve block management in metablocks, which are logical groupings of blocks in the storage device. For instance, when the controller(s) initiate a page0read request during UGSD recovery such as previously described at blocks 1402 and 1412, the controller(s) may apply this page read request for each FIM and plane condition, or each block in metablock 802, while consolidating the results from each FIM/plane condition to determine the metablock condition. More particularly, if the controller(s) identify that each block in the metablock 802 includes a same erased block type, for example, that each block 0 in metablock 802 are SLC erase blocks (or each XLC erase blocks), the controller(s) may place the metablock into an appropriate list or heap for subsequent operations (e.g., SLCs for SLC metablocks and XLCs for XLC metablocks) without performing unnecessary flash fill and erase operations and thereby saving PECs. Table 9 illustrates an example of this behavior, in which the controller(s) may apply the metablock for hybrid SLC operations or XLC operations depending on which erase block type is identified to be the same for each block of metablock 802 according to the process of FIGS. 14 and 15.

TABLE 9

Erase Type Decision based on metablock condition

| FIM0 | FIM1 | FIM2 | FIM3 | Decision(metablock) |
|---|---|---|---|---|
| SLC erased | SLC erased | SLC erased | SLC erased | Use as "Hybrid SLC" |
| XLC erased | XLC erased | XLC erased | XLC erased | Use as "XLC" |

Alternatively, if the controller(s) do not identify same erase block types in the metablock due to an erase abort condition or other error having occurred, the controller(s) may also handle these conditions using the erase type detection mechanism of the present disclosure. For instance, in some cases the controller(s) may perform an erase operation on multiple blocks of a metablock 802, but some of these blocks fail to properly erase due to an erase abort. Similarly, in some cases when an XLC erase operation is performed on a metablock, some blocks may be incorrectly classified as SLC erased due to an error caused by a UGSD. These errors may include, for example, a control sync failure, improper synchronization of some of the FIMs associated with the metablock 802, or an XLC erase operation on SLC pre-erased blocks which succeeds for some of the blocks in the metablock 802 but not others. In such cases, in typical UGSD recovery mechanisms such as described with respect to FIGS. 11 and 12 where the controller(s) did not ascertain which block type the metablock was intended to cover prior to the UGSD, the controller(s) would flash fill and erase the metablock as one block type in a similar manner as that described with respect to block 1212 of FIG. 12 using a SLC erase or an XLC erase. While this synchronization operation would prevent potential issues related to subsequent programming with a mismatched block type, it would also inefficiently increase the PEC of each block in the metablock. Moreover, in the case of an erase abort condition, the controller(s) would also perform another erase operation on the erase aborted blocks to address the resulting mismatch of PECs between the successfully erased blocks in the metablock and erase aborted blocks in the metablock. As a result, the PEC counts of the erase aborted blocks would inefficiently increase even further (e.g., by 2 in total following a UGSD) to synchronize the PEC counts of all blocks in the metablock 802.

Figure 16:
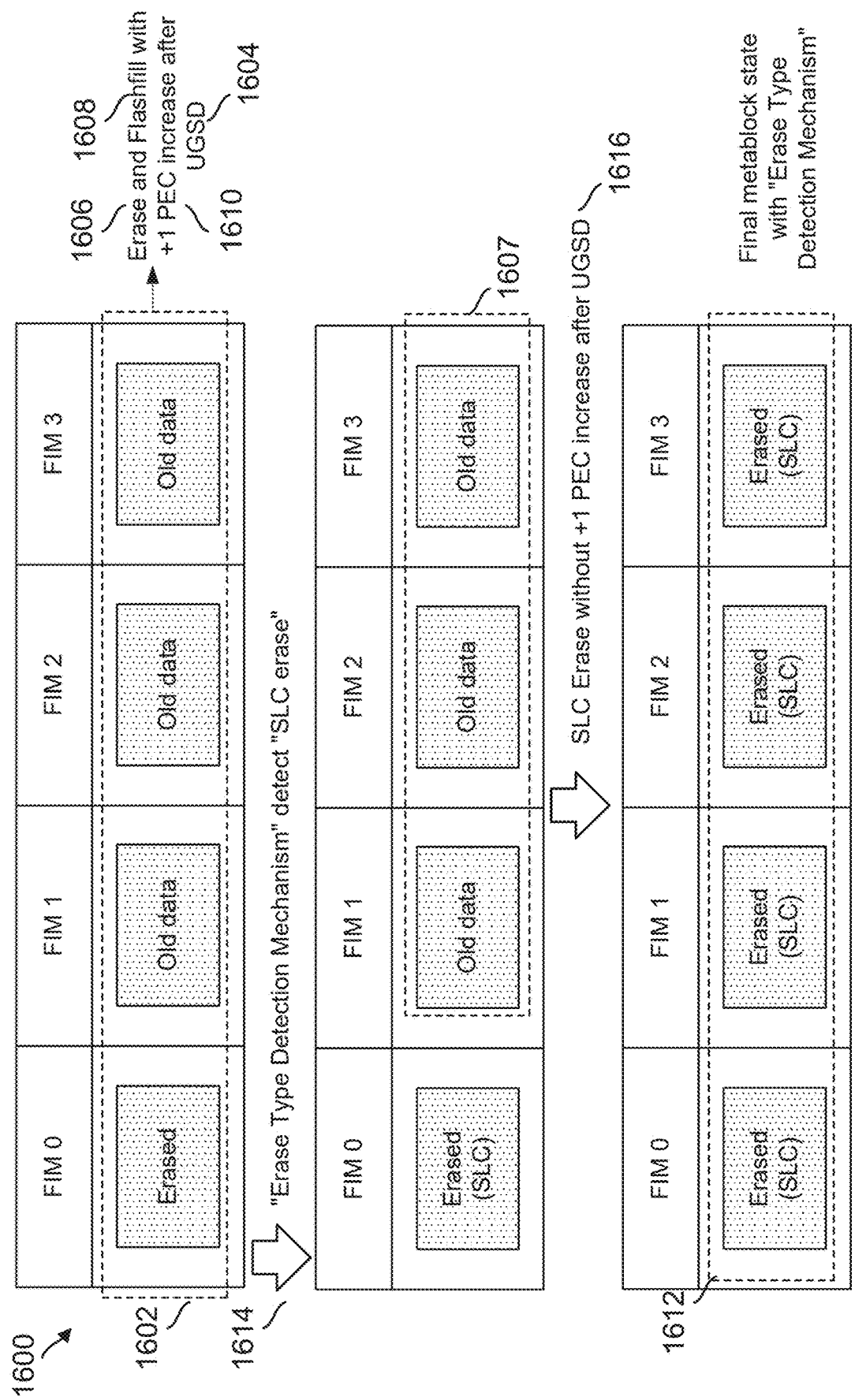
FIG. 16 is a conceptual diagram illustrating an example of an erase abort condition in which erase type detection is applied to a metablock in the storage device of FIG. 1.

FIG. 16 illustrates an example 1600 of an erase abort condition in which the erase type detection mechanism may be applied to a metablock 1602 intended to be written with host data. The controller(s) may detect an erase abort has occurred by, for example, comparing a PEC value stored in FW control data for a block in metablock 1602 (e.g., as a result of a control sync) with a PEC value for that block stored in metadata of the metablock 1602 (e.g., as a result of a successful erase). If at least one block is identified as erased (e.g., the PEC values for the respective block(s) in the control data and metadata match in response to a successful erase) but at least one block is identified as old data or in an UECC condition (e.g., the PEC values for the respective block(s) do not match in response to a failed erase due to a UGSD), the controller(s) determine the metablock 1602 to have an erase abort condition. For instance, in the illustrated example 1600, metablock 1602 may be determined to have an erase abort condition since the block associated with FIM 0 is identified to be successfully erased but the blocks associated with FIMs 1-3 are identified to include old data as a result of failed erasures due to UGSD 1604.

When an erase abort condition is determined as a result of UGSD 1604 in typical storage devices without the aforementioned erase type detection mechanism of the present disclosure, the controller(s) typically perform an erase operation 1606 in the erase aborted blocks 1607 of the metablock 1602, followed by a flash fill operation 1608 of these erase aborted blocks 1607 and then a subsequent erase operation 1610 of the metablock 1602 to synchronize the erase block type of the metablock 1602. For example, in the metablock 1602 of FIG. 16, the controller(s) may erase and flash fill the old data blocks associated with FIMs 1-3, and then subsequently re-erase the blocks associated with FIMs 0-3 in metablock 1602 to result in a synchronized metablock 1612 with same erase block type such as hybrid SLC. This process may inefficiency increase the PEC count of the erase aborted blocks by 2 PECs compared to before the UGSD.

Accordingly, to address this inefficiency in erase abort or mismatched block type conditions of metablocks, in the erase type detection mechanism of the present disclosure, the controller(s) determine the block type of the block(s) associated with the FIM(s) that properly erased, for example, based on threshold comparisons during XLC and SLC page checks or DMC reads such as previously described with respect to FIGS. 14 and 15. In response to identifying the erase block type of the successfully erased block(s), the controller(s) may perform an erase using the identified erase type on all other blocks in the metablock 802, 1602 including the erase aborted blocks 1607. For example, if the controller(s) determine during a DMC read that one of the blocks in a metablock was SLC erased as a hSLC metablock, while the other blocks in the metablock were erase aborted (and thus contain old data), the controller(s) may perform an SLC erase operation on the un-erased blocks to synchronize the block types as hSLCs, without undergoing additional erases and thus avoiding incurring further inefficient PEC increments. Similarly, if the controller(s) determine during a DMC read that one of the blocks in the metablock was XLC erased while the other blocks in the metablock were SLC erased due to an XLC erase error in those blocks, the controller(s) may perform an XLC erase operation on the SLC blocks to synchronize the block types, without undergoing additional erases and further PEC increases. Table 10 outlines the possible scenarios of erase abort or block type mismatch cases that this erase type detection mechanism may handle.

TABLE 10

Erase Type Decision for Erase Abort condition

| FIM 0 | FIM 1 | FIM 2 | FIM 3 | Decision(metablock) |
|---|---|---|---|---|
| SLC erased | XLC erased | SLC erased | SLC erased | More than one block returned XLC erased. Send XLC erase operation on SLC erased block type blocks without +1 PEC increase. And use as "XLC" |
| SLC erased | Old data written | Old data written | Old data written | More than one block returned SLC erased and other blocks returned as old data. Send SLC erase operation on un-erased blocks. And use as "Hybrid SLC" |
| XLC erased | Old data written | Old data written | Old data written | More than one block returned XLC erased and other blocks returned as old data. Send XLC erase operation on un-erased blocks. And use as "XLC" |

For instance, referring back to the example 1600 of FIG. 16, using the erase type detection mechanism of the present disclosure, the controller(s) may identify at 1614 the erase block type of the successfully erased block in the metablock 1602 (e.g., using page0reads and DMC reads compared against thresholds as previously described for a single block but in this case for each block of the metablock), and then at 1616 the controller(s) may simply erase the old data blocks or erase aborted blocks 1607 using the same identified erase block type to result in the synchronized metablock 1612 with the same erase block type. Here, since the controller(s) perform the single erase operation 1616 to synchronize the erase block type of metablock 1602, instead of flash fill operation 1608 and two erase operations 1606 and 1610 to synchronize the block types, the controller(s) may avoid an unnecessary +1 PEC increase to the blocks of the metablock 1602. Similarly, if a different condition than an erase abort condition occurs where all the blocks in metablock 1602 are identified as erased (there was no erase aborted blocks), but due to an error in the erasure, the blocks in the metablock were not all erased using the same block type (e.g., some correctly underwent an MLC erase, others erroneously underwent a SLC erase, or vice-versa), the controller(s) may apply the correct erase block type operation on the incorrectly erased blocks to create a same block type erased metablock condition, such as applying a MLC erase on the SLC erased blocks of the metablock or vice-versa, thus also preventing a +1 PEC increase.

Figure 17:
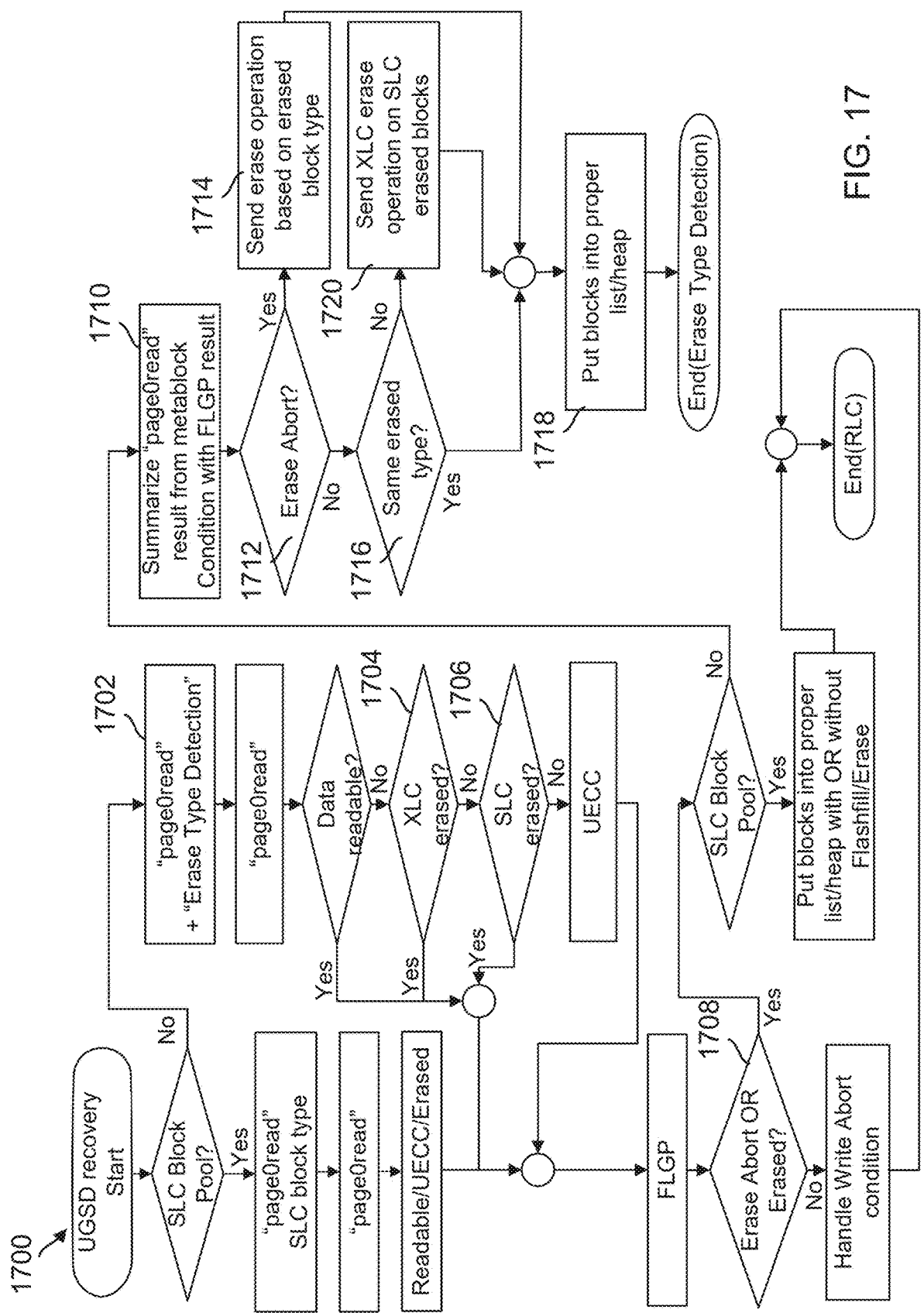
FIG. 17 is a flow chart illustrating an example of a UGSD recovery process including erase type detection for a metablock in the storage device of FIG. 1.

FIG. 17 illustrates an example 1700 of a controller process for UGSD recovery which employs the erase type detection mechanism of the present disclosure in a metablock condition including XLC blocks. At block 1702, during a page0read operation for blocks in a metablock such as metablock 1602, the controller(s) determine the block condition associated with each FIM by identifying the erased block type such as described with respect to 1614 in FIG. 16. More particularly, the controller(s) may initiate a page0read operation for each block associated with a given FIM and plane in the metablock 1602, such as described with respect to block 1402 and 1412 in FIG. 9. Then at blocks 1704 and 1706, the controller(s) may identify the erased block type in each block of the metablock 1602. More particularly, the controller(s) may perform a DMC read and compare operation for each block associated with a given FIM and plane in the metablock 1602 to potentially determine the erase block type of each block, such as described with respect to blocks 1406, 1408, 1414, and 1416 in FIGS. 14 and 15. The controller(s) may also detect an erase abort event at block 1708 after comparing the respective PEC values between the FW control data and the metadata for each block.

After the page0read operations for the metablock 1602 are completed and consolidated or summarized with other UGSD-related determinations such as FLGP results at block 1710, the controller(s) may identify the metablock condition to decide on the subsequent operation. For instance, if an erase abort is detected at block 1712, the controller(s) may perform an erase operation at block 1714 using the identified erased block type (e.g., SLC or XLC) on old data blocks or erase aborted blocks 1607 to synchronize the erased block type in the metablock 1612, such as described at 1616 in FIG. 16. Otherwise, in case where this is a mismatched block type situation rather than an erase abort condition, the controller(s) may determine at block 1716 whether the erased type is the same across the blocks in metablock 1602. If the erased type is consistent across the metablock condition (e.g., all the blocks are identified to be SLC erased or identified to be XLC erased) such as illustrated in metablock 1612 of FIG. 16, the controller(s) at block 1718 may place the metablock into an appropriate list or heap for subsequent operations, such as allocating the metablock to a list or heap of SLC metablocks for SLC-only operations, without the need for unnecessary flash fill operations 1608 and subsequent erase operations 1610. Alternatively, if the block condition varies across the metablock 1602 such that the erased type is different between blocks in the metablock, indicating that the metablock should have been completely XLC erased but some SLC erased blocks incorrectly remain, the controller(s) at block 1720 may initiate an erase operation using the XLC erased block type on the SLC erased blocks to synchronize the metablock as XLC-erased. Subsequently, at block 1718, the controller(s) may place the metablock into an appropriate list or heap for subsequent operations, such as allocating the metablock to a list or heap of XLC metablocks for XLC-only operations, without the need for unnecessary flash fill operations 1608 and subsequent erase operations 1610.

Figure 18:
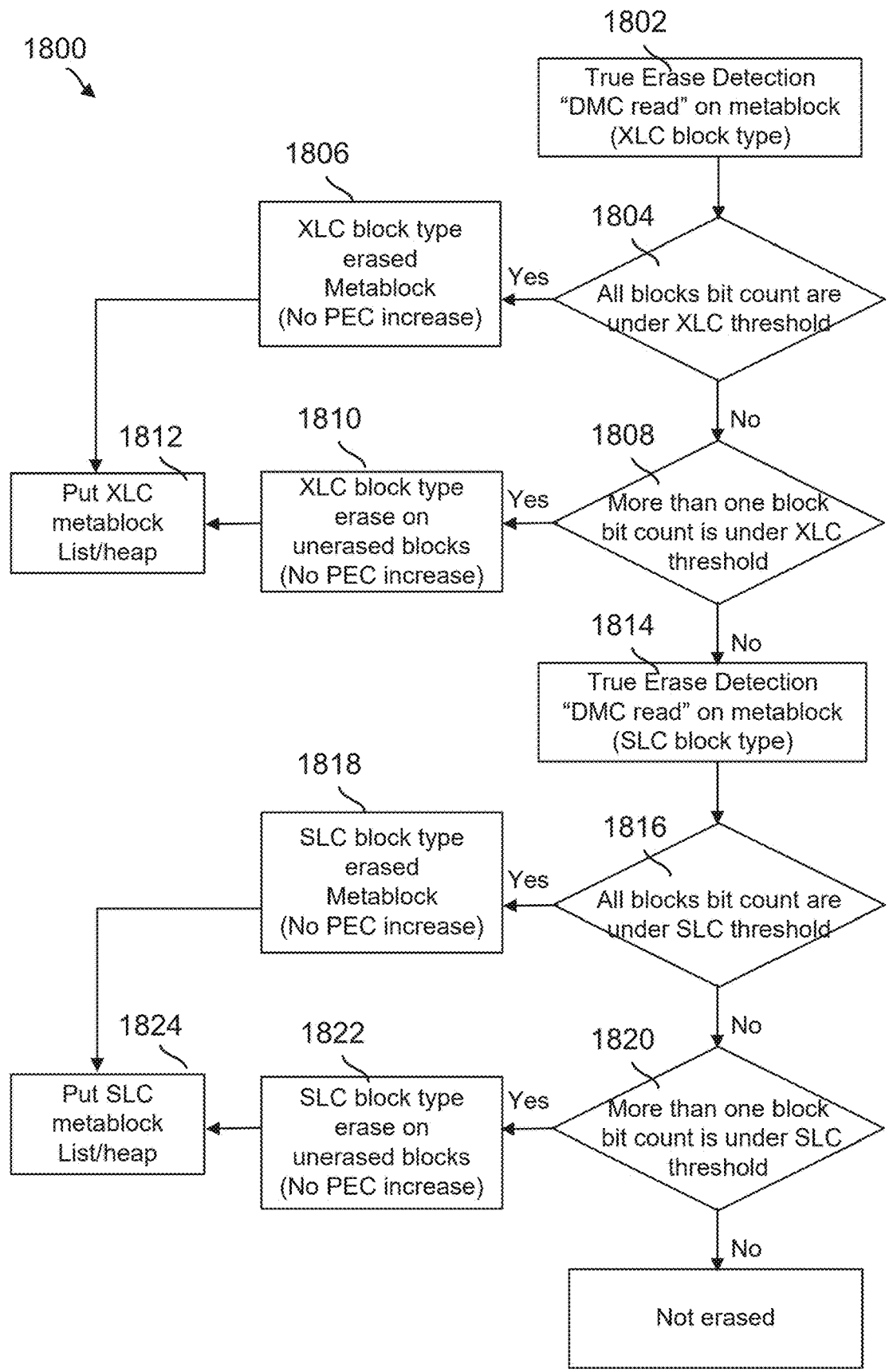
FIG. 18 is a flow chart illustrating an example of erase type detection including DMC read operations employed in a metablock in the storage device of FIG. 1.

FIG. 18 illustrates an example 1800 of the erase type detection mechanism employed on a metablock condition in the UGSD recovery process of FIG. 17. Initially, at block 1802, the controller(s) may perform a DMC read on each block of the metablock 1602 to detect whether a true erase condition exists indicating these blocks are XLC block types, such as described with respect to 1406 in FIG. 14 and block 1704 of the UGSD recovery process of FIG. 17. If at block 1804, the controller(s) determine the bit counts of the blocks each do not exceed the XLC bit count threshold, then at block 1806, the controller(s) may identify the metablock is a synchronized metablock 1612 with an XLC erased block type without incurring the inefficient+1 PEC increase associated with typical UGSD recovery mechanisms. Otherwise, at block 1808, if the controller(s) determine that at least one bit count of the blocks in metablock 1602 do not exceed the XLC bit count threshold (and thus that these block(s) have an XLC erased block type), but not all of threshold conditions are met due to for example there having been an erase abort or some other error, then at block 1810, the controller(s) may perform an XLC block type erase on the un-erased or mismatched erase type blocks to result in synchronized metablock 1612 with the XLC erased block type (again without incurring the inefficient+1 PEC increase). In either case, whether the scenario is same block type or different block types/erase abort, at block 1812, the controller(s) may place the XLC metablock in its associated list or heap for subsequent operations, such as described with respect to block 1718 in FIG. 17.

On the other hand, if none of the aforementioned conditions at blocks 1804 and 1808 are met for XLCs, then at block 1814, the controller(s) may perform a DMC read on each block of the metablock 1602 to detect whether a true erase condition exists indicating these blocks are SLC block types, such as described with respect to 1414 in FIG. 14 and block 1706 of the UGSD recovery process of FIG. 17. If at block 1816, the controller(s) determine the bit counts of the blocks each do not exceed the SLC bit count threshold, then at block 1818, the controller(s) may identify the metablock is a synchronized metablock 1612 with an SLC erased block type without incurring the inefficient +1 PEC increase associated with typical UGSD recovery mechanisms. Otherwise, at block 1820, if the controller(s) determine that at least one bit count of the blocks in metablock 1602 do not exceed the SLC bit count threshold (and thus that these block(s) have an SLC erased block type), but not all of threshold conditions are met due to for example there having been an erase abort or some other error, then at block 1822, the controller(s) may perform an SLC block type erase on the un-erased or mismatched erase type blocks to result in synchronized metablock 1612 with the SLC erased block type (again without incurring the inefficient +1 PEC increase). In either case, whether the scenario is same block type or different block types/erase abort, at block 1824, the controller(s) may place the SLC metablock in its associated list or heap for subsequent operations, such as described with respect to block 1718 in FIG. 17.

Accordingly, in storage devices that do not implement the erase type detection mechanism of the present disclosure, erase abort cases may result in the controller(s) triggering unnecessary erase and flash fill operations on erase aborted blocks for metablock synchronization, thereby resulting in an inefficient +1 PEC increase in these un-erased blocks to achieve a same PEC across all blocks in the metablock 1612. However, since the erase type detection mechanism of the present disclosure allows the controller(s) to detect the erase type of the metablock 1602 from the erased blocks following the erase abort condition, the controller(s) may simply erase the un-erased blocks once to synchronize the metablock 1612 while avoiding subsequently flash filling and re-erasing these blocks. This prevents inefficient increments of PECs which may significantly impact the lifespan of SSDs, particularly those using high-scalable MLC NAND technology (e.g., QLC, PLC, and next N-Level Cell). For example, Table 11 highlights the PEC differences in a metablock condition between UGSD recovery mechanisms with and without the erase type detection mechanism of the present disclosure, particularly for metablocks in hybrid block pools that may include multiple erase block types following a UGSD.

TABLE 11

PEC increment difference on metablock condition

| Metablock condition | PEC increment difference | |
|---|---|---|
| | With "Erase Type Detection Mechanism" | Without "Erase Type Detection Mechanism" |
| All blocks are erased as 'XLC' | No increment | +2 PEC increment on metablock (+1 PEC increase due to previous erase operation) |
| All blocks are erased as 'SLC' | No increment | +2 PEC increment on metablock (+1 PEC increase due to previous erase operation) |
| Erase Abort More than one block has been erased as 'XLC' | XLC Erase on un-erased blocks No increment | Total +2 PEC increment on metablock (+1 PEC increase due to previous erase operation) |
| Erase Abort More than one block has been erased as 'SLC' | XLC Erase on un-erased blocks No increment | Total +2 PEC increment on metablock (+1 PEC increase due to previous erase operation) |
| Erase Abort Showing different erase block type 'XLC' + 'SLC' | XLC Erase on un-erased blocks and SLC erased block No increment (Sending XLC erase operation on SLC erased blocks are permitted without increasing +1 PEC) | Total +2 PEC increment on metablock (+1 PEC increase due to previous erase operation) |

Figure 19:
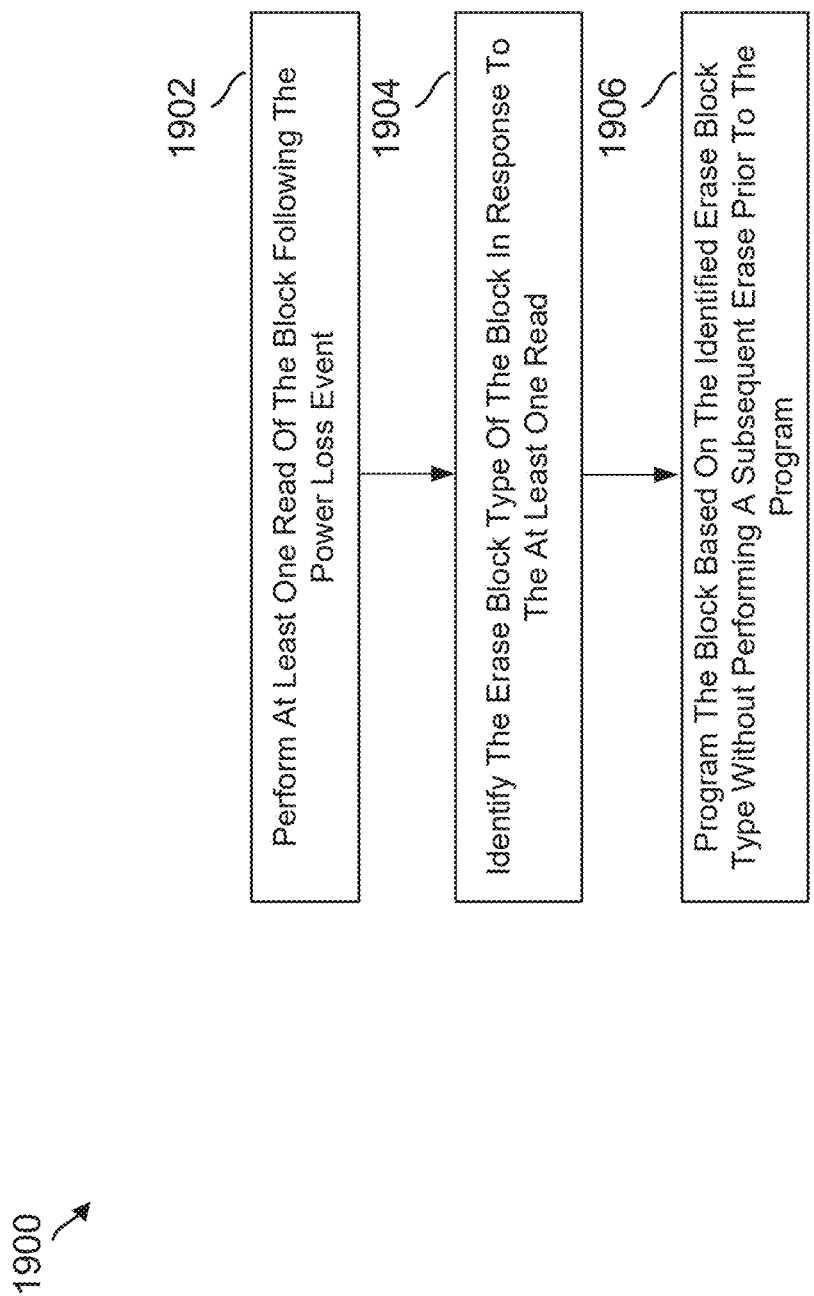
FIG. 19 is a flow chart illustrating an example of a method for handling erase type detection and associated operations in the storage device of FIG. 1.

FIG. 19 illustrates an example flow chart 1900 of a method for handling detection and operations associated with an erase block type of a block in one or more non-volatile memories of a storage device following erasure of the block prior to a power loss event. For example, the method can be carried out in a storage device 102 such as the one illustrated in FIG. 1. Each of the steps in the flow chart can be controlled using one or more controllers, individually or in combination, as described below (e.g., controller(s) 123), by a component or module of one or more of the controller(s), or by some other suitable means. For example, the controller(s) 123 of storage device 102, individually or in combination, may include software, firmware, hardware, and/or a combination of software, firmware, and/or hardware, that is configured to detect, following erasure (e.g., at flowchart block 1202) of the block (e.g., block 402, 702 in NVM(s) 110) prior to a power loss event (e.g., a power reset at flowchart block 1204), whether block 402, 702 has MLC block type 1346 (e.g., is XLC block 1002, 1007) or SLC block type 1344 (e.g., is hSLC block 1006). In various aspects, the power loss event may be a UGSD of the storage device (e.g., UGSD 908, 1008, 1604).

At block 1902, the controller(s), individually or in combination, perform at least one read of the block (e.g., a page0read operation at block 1402, 1412, or 1702) following the power loss event (e.g., the UGSD 908, 1008, 1604).

At block 1904, the controller(s), individually or in combination, identify (e.g., at flowchart blocks 1410, 1418, 1502, 1504, 1806, or 1818) the erase block type of the block (e.g., whether block 402, 702 has MLC block type 1346 or SLC block type 1344) in response to the at least one read.

At block 1906, the controller(s), individually or in combination, program the block (e.g., perform subsequent program operation 1214) based on the identified erase block type (e.g., an MLC program operation if MLC block type 1346 or an SLC program operation if SLC block type 1344). The controller(s), individually or in combination, program the block without performing a subsequent erase prior to the program (e.g., without performing erase operation 912, 1012 at flowchart block 1212 or subsequent erase operations 1610), thereby avoiding the aforementioned +1 PEC increase associated with typical UGSD recovery mechanisms.

In some aspects, the controller(s) may, individually or in combination, perform a MLC read of a page of the block when performing the at least one read of the block (e.g., a MLC read operation during the page0read at flowchart block 1402), determine whether a number of bits corresponding to an MLC erase state which are read from the page is less than a bit count threshold (e.g., as described with respect to flowchart blocks 1406, 1408), and identify the erase block type to be MLC in response to the number of bits being less than the bit count threshold (e.g., MLC block type 1346 at flowchart block 1502).

In some aspects, the controller(s) may, individually or in combination, perform an MLC read of a page of the block when performing the at least one read of the block (e.g., a MLC read operation during the page0read at flowchart block 1402), determine whether a first number of bits corresponding to an erase state which are read from the page is greater than or equal to a first bit count threshold (e.g., as described with respect to flowchart blocks 1406, 1408), perform an SLC read of the page of the block in response to the first number of bits being greater than or equal to the first bit count threshold when performing the at least one read of the block (e.g., an SLC read operation during the page0read operation at flowchart block 1412), determine whether a second number of bits corresponding to an SLC erase state which are read from the page is less than a second bit count threshold (e.g., as described with respect to flowchart blocks 1414, 1416), and identify the erase block type to be SLC in response to the second number of bits being less than the second bit count threshold (e.g., SLC block type 1344 at flowchart block 1504).

In some aspects, the controller(s) may, individually or in combination, perform the at least one read of a page in each of the blocks (e.g., the page0read operation at flowchart block 1702), the blocks being of a metablock and being associated with different channels and planes (e.g., blocks 702 of metablock 802, 1602 are associated with different channels 602 and planes 704), identify the erase block type of the each of the blocks (e.g., MLC block type 1346 or SLC block type 1344) based on a number of bits read from the pages and one or more bit count thresholds (e.g., as described with respect to 1614 or flowchart blocks 1704, 1706, 1802, 1804, 1808, 1814, 1816, 1820), and perform a metablock operation associated with the erase block type (e.g., at flowchart block 1718, such as allocating metablock 1612 to an XLC metablock list/heap at flowchart block 1812 or to an SLC metablock list/heap at flowchart block 1824), without erasing the metablock prior to the metablock operation (e.g., without performing subsequent erase operations 1610 or the erases at flowchart block 1810 or 1822), in response to the identified erase block type being same for each of the blocks (e.g., all XLCs as described with respect to flowchart block 1806 or all SLCs as described with respect to flowchart block 1818).

In some aspects, the controller(s), individually or in combination, may perform the at least one read of a page in each of the blocks (e.g., the page0read operation at flowchart block 1702), the blocks being of a metablock and being associated with different channels and planes (e.g., blocks 702 of metablock 802, 1602 are associated with different channels 602 and planes 704), identify the erase block type of one or more of the blocks (e.g., MLC block type 1346 or SLC block type 1344) based on a number of bits read from the pages and one or more bit count thresholds (e.g., as described with respect to 1614 or flowchart blocks 1704, 1706, 1802, 1804, 1808, 1814, 1816, 1820); determine whether at least one of the blocks is an erase aborted block (e.g., erase aborted block 1607 such as at flowchart block 1712); erase the erase aborted block (e.g., at 1616 or flowchart block 1714) based on the identified erase block type (e.g., at flowchart block 1810 if MLC block type 1346 or flowchart block 1820 if SLC block type 1344), without subsequently programming and re-erasing the erase aborted block (e.g., without performing flash fill operation 1608 and subsequent erase operations 1610), and perform a metablock operation associated with the identified erase block type after the erase of the erase aborted block (e.g., at flowchart block 1718, such as allocating metablock 1612 to an XLC metablock list/heap at flowchart block 1812 or to an SLC metablock list/heap at flowchart block 1824).

In some aspects, the one or more non-volatile memories each include a plurality of blocks including the block (e.g., NVM(s) 110 may include blocks 402, 702), and the controller(s), individually or in combination, may perform the at least one read of a page in each of the blocks (e.g., the page0read operation at flowchart block 1702), the blocks being of a metablock and being associated with different channels and planes (e.g., blocks 702 of metablock 802, 1602 are associated with different channels 602 and planes 704), identify the erase block type of one or more of the blocks (e.g., MLC block type 1346 or SLC block type 1344)

based on a number of bits read from the pages and one or more bit count thresholds (e.g., as described with respect to 1614 or flowchart blocks 1704, 1706, 1802, 1804, 1808, 1814, 1816, 1820), determine whether the identified erase block types are not same for the each of the blocks (e.g., at no branch of flowchart block 1716) in response to at least one of the blocks being identified with a different erase block type (e.g., at least one block in metablock 1602 has MLC block type 1346 while other block(s) in the same metablock have SLC block type 1344), erase the one or more of the blocks associated with the identified erase block type based on the different erase block type (e.g., at flowchart block 1720), without subsequently programming and re-erasing the one or more of the blocks (e.g., without performing flash fill operation 1608 and subsequent erase operations 1610), and perform a metablock operation associated with the different erase block type after the erase of the one or more of the blocks (e.g., at flowchart block 1718, such as allocating metablock 1612 to an XLC metablock list/heap at flowchart block 1812). In some aspects, the identified erase block type is SLC (e.g., SLC block type 1344), and the different erase block type is MLC (e.g., MLC block type 1346).

In some aspects, the block is initially associated with an initial erase block type (e.g., block 402, 702 is initially XLC block 902, 1002 with MLC block type 1346), and the controller(s), individually or in combination, may configure the block to change an association from the initial erase block type to the erase block type prior to the power loss event (e.g., XLC block 902, 1002 may be allocated as hSLC block 906, 1006 with SLC block type 1344 at 904, 1004 prior to UGSD 908, 1008).

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order and are not meant to be limited to the specific order or hierarchy presented.

Figure 20:
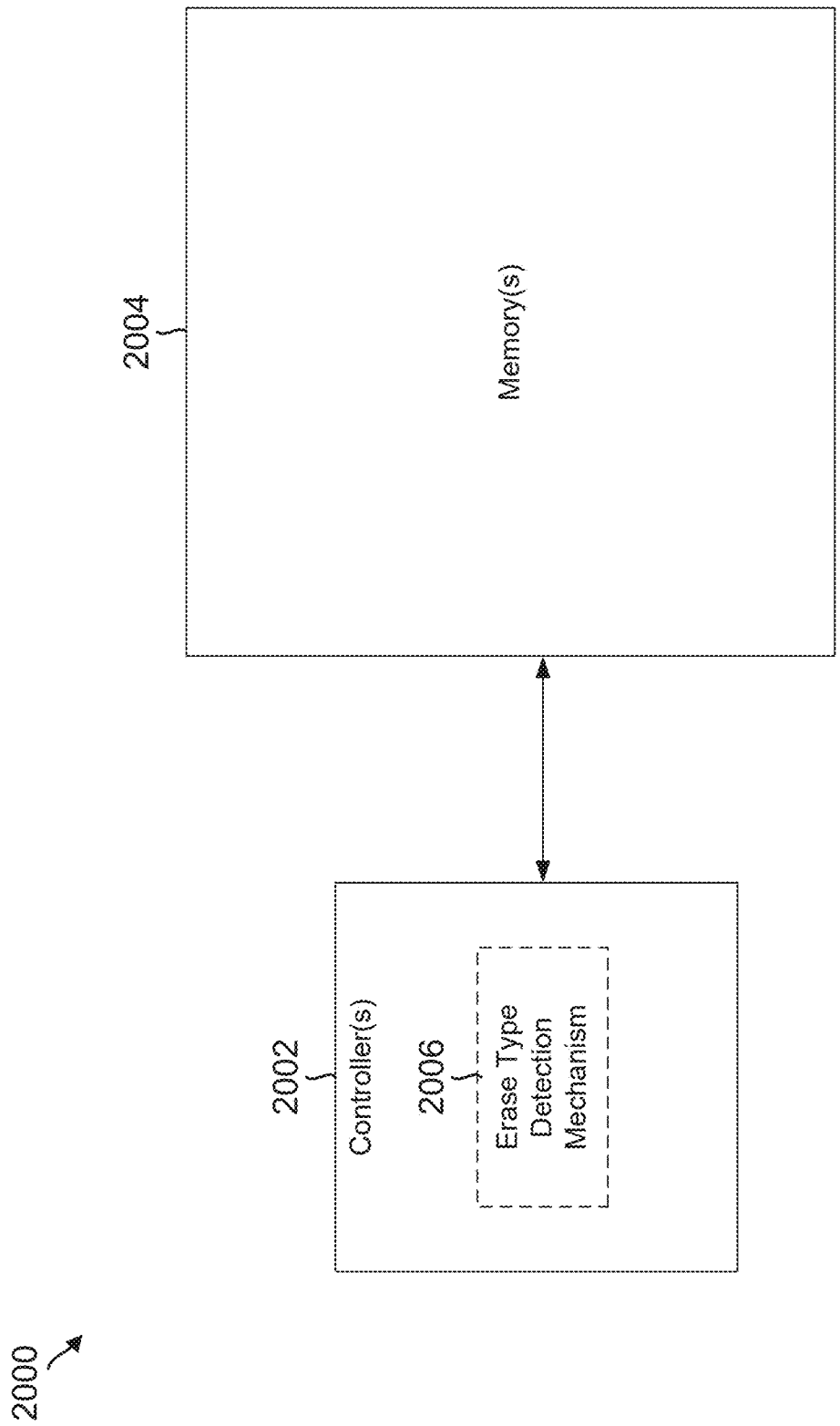
FIG. 20 is a conceptual diagram illustrating an example of one or more controllers that individually or in combination handle erase type detection and associated operations in the storage device of FIG. 1.

FIG. 20 is a conceptual diagram illustrating an example 2000 of one or more controllers 2002 each coupled to one or more memories 2004 in a storage device. For example, controller(s) 2002 may correspond to controller(s) 123 and the one or more memories 2004 may correspond to a computer-readable medium in storage device 102 of FIG. 1, such as the NVM(s) 110, 201 or one or more of the volatile memories 117, 118. The computer-readable medium/one or more memories 2004 may be non-transitory. The one or more controllers 2002 may execute software stored on the computer-readable medium/one or more memories 2004 individually or in combination. The software, when executed by the one or more controllers 2002, causes the one or more controllers to, individually or in combination, perform the various functions described supra. The controller(s) may be implemented in software, hardware, or a combination of hardware and software. In one exemplary embodiment, the controller(s) are each implemented with several software modules executed on one or more processors to perform the various controller functions previously described, but as those skilled in the art will appreciate, the controller(s) may be implemented in different ways. The skilled artisan will readily understand how best to implement the controller(s) based on the particular design parameters of the system.

In one example, the controller(s) 2002 individually or in combination include an erase type detection mechanism 2006 that may provide a means for handling detection and operations associated with an erase block type of the block following erasure of the block prior to a power loss event. For example, the erase type detection mechanism 2006 may perform the process described above with respect to FIG. 19, including performing at least one read of the block following the power loss event, identifying the erase block type of the block in response to the at least one read, and programming the block based on the identified erase block type without performing a subsequent erase prior to the program. In some aspects, the block is initially associated with an initial erase block type, and the means for handling is further configured to configure the block to change an association from the initial erase block type to the erase block type prior to the power loss event. As previously described, the controller(s) may each be implemented with software modules executed on one or more processors, or may otherwise be implemented in firmware, hardware, and/or a combination of software, firmware and/or hardware. Thus, the aforementioned means may be a software module, firmware, hardware, and/or a combination of software, firmware and/or hardware, configured in the controller(s) to individually or in combination perform one or more operations of the process described above with respect to FIG. 19.

Implementation examples are described in the following numbered clauses:

Clause 1. A storage device, comprising: one or more non-volatile memories each including a block; and one or more controllers each communicatively coupled with at least one of the one or more non-volatile memories, the one or more controllers, individually or in any combination, operable to cause the storage device to: erase the block prior to a power loss event, the block being associated with an erase block type; perform at least one read of the block following the power loss event; identify the erase block type of the block in response to the at least one read; and program the block based on the identified erase block type without performing a subsequent erase prior to the program.

Clause 2. The storage device of clause 1, wherein the one or more controllers, individually or in combination, are further operable to cause the storage device to: perform a multi-level cell (MLC) read of a page of the block when performing the at least one read of the block; determine whether a number of bits corresponding to an MLC erase state which are read from the page is less than a bit count threshold; and identify the erase block type to be MLC in response to the number of bits being less than the bit count threshold.

Clause 3. The storage device of clause 1, wherein the one or more controllers, individually or in combination, are further operable to cause the storage device to: perform a multi-level cell (MLC) read of a page of the block when performing the at least one read of the block; determine whether a first number of bits corresponding to an erase state which are read from the page is greater than or equal to a first bit count threshold; perform a single-level cell (SLC) read of the page of the block in response to the first number of bits being greater than or equal to the first bit count threshold when performing the at least one read of the block; determine whether a second number of bits corresponding to an SLC erase state which are read from the page is less than a second bit count threshold; and identify the erase block type to be SLC in response to the second number of bits being less than the second bit count threshold.

Clause 4. The storage device of any of clauses 1 to 3, wherein the one or more non-volatile memories each include a plurality of blocks including the block, and the one or more controllers, individually or in combination, are further operable to cause the storage device to: perform the at least one read of a page in each of the blocks, the blocks being of a metablock and being associated with different channels and planes; identify the erase block type of the each of the blocks based on a number of bits read from the pages and one or more bit count thresholds; and perform a metablock operation associated with the erase block type without erasing the metablock prior to the metablock operation in response to the identified erase block type being same for each of the blocks.

Clause 5. The storage device of any of clauses 1 to 3, wherein the one or more non-volatile memories each include a plurality of blocks including the block, and the one or more controllers, individually or in combination, are further operable to cause the storage device to: perform the at least one read of a page in each of the blocks, the blocks being of a metablock and being associated with different channels and planes; identify the erase block type of one or more of the blocks based on a number of bits read from the pages and one or more bit count thresholds; determine whether at least one of the blocks is an erase aborted block; erase the erase aborted block based on the identified erase block type without subsequently programming and re-erasing the erase aborted block; and perform a metablock operation associated with the identified erase block type after the erase of the erase aborted block.

Clause 6. The storage device of any of clauses 1 to 3, wherein the one or more non-volatile memories each include a plurality of blocks including the block, and the one or more controllers, individually or in combination, are further operable to cause the storage device to: perform the at least one read of a page in each of the blocks, the blocks being of a metablock and being associated with different channels and planes; identify the erase block type of one or more of the blocks based on a number of bits read from the pages and one or more bit count thresholds; determine whether the identified erase block types are not same for the each of the blocks in response to at least one of the blocks being identified with a different erase block type; erase the one or more of the blocks associated with the identified erase block type based on the different erase block type without subsequently programming and re-erasing the one or more of the blocks; and perform a metablock operation associated with the different erase block type after the erase of the one or more of the blocks.

Clause 7. The storage device of clause 6, wherein the identified erase block type is single-level cell (SLC), and the different erase block type is multi-level cell (MLC).

Clause 8. The storage device of any of clauses 1 to 7, wherein the block is initially associated with an initial erase block type, and the one or more controllers, individually or in combination, are further operable to cause the storage device to: configure the block to change an association from the initial erase block type to the erase block type prior to the power loss event.

Clause 9. The storage device of any of clauses 1 to 8, wherein the power loss event is an ungraceful shutdown (UGSD) of the storage device.

Clause 10. A method for handling detection and operations associated with an erase block type of a block in one or more non-volatile memories of a storage device following erasure of the block prior to a power loss event, the method comprising: performing at least one read of the block following the power loss event; identifying the erase block type of the block in response to the at least one read; and programming the block based on the identified erase block type without performing a subsequent erase prior to the program.

Clause 11. The method of clause 10, further comprising: performing a multi-level cell (MLC) read of a page of the block when performing the at least one read of the block; determining whether a number of bits corresponding to an MLC erase state which are read from the page is less than a bit count threshold; and identifying the erase block type to be MLC in response to the number of bits being less than the bit count threshold.

Clause 12. The method of clause 10, further comprising: performing a multi-level cell (MLC) read of a page of the block when performing the at least one read of the block; determining whether a first number of bits corresponding to an erase state which are read from the page is greater than or equal to a first bit count threshold; performing a single-level cell (SLC) read of the page of the block in response to the first number of bits being greater than or equal to the first bit count threshold when performing the at least one read of the block; determining whether a second number of bits corresponding to an SLC erase state which are read from the page is less than a second bit count threshold; and identifying the erase block type to be SLC in response to the second number of bits being less than the second bit count threshold.

Clause 13. The method of any of clauses 10 to 12, wherein the one or more non-volatile memories each include a plurality of blocks including the block, and the method further comprises: performing the at least one read of a page in each of the blocks, the blocks being of a metablock and being associated with different channels and planes; identifying the erase block type of the each of the blocks based on a number of bits read from the pages and one or more bit count thresholds; and performing a metablock operation associated with the erase block type without erasing the metablock prior to the metablock operation in response to the identified erase block type being same for each of the blocks.

Clause 14. The method of any of clauses 10 to 12, wherein the one or more non-volatile memories each include a plurality of blocks including the block, and the method further comprises: performing the at least one read of a page in each of the blocks, the blocks being of a metablock and being associated with different channels and planes; identifying the erase block type of one or more of the blocks based on a number of bits read from the pages and one or more bit count thresholds; determining whether at least one of the blocks is an erase aborted block; erasing the erase aborted block based on the identified erase block type without subsequently programming and re-erasing the erase aborted block; and performing a metablock operation associated with the identified erase block type after the erase of the erase aborted block.

Clause 15. The method of any of clauses 10 to 12, wherein the one or more non-volatile memories each include a plurality of blocks including the block, and the method further comprises: performing the at least one read of a page in each of the blocks, the blocks being of a metablock and being associated with different channels and planes; identifying the erase block type of one or more of the blocks based on a number of bits read from the pages and one or more bit count thresholds; determining whether the identified erase block types are not same for the each of the blocks in response to at least one of the blocks being identified with a different erase block type; erasing the one or more of the blocks associated with the identified erase block type based on the different erase block type without subsequently programming and re-erasing the one or more of the blocks; and perform a metablock operation associated with the different erase block type after the erase of the one or more of the blocks.

Clause 16. The method of clause 15, wherein the identified erase block type is single-level cell (SLC), and the different erase block type is multi-level cell (MLC).

Clause 17. The method of any of clauses 10 to 16, wherein the block is initially associated with an initial erase block type, and the method further comprises: configuring the block to change an association from the initial erase block type to the erase block type prior to the power loss event.

Clause 18. The method of any of clauses 10 to 17, wherein the power loss event is an ungraceful shutdown (UGSD) of the storage device.

Clause 19. A storage device, comprising: one or more non-volatile memories each including a block; and means for handling detection and operations associated with an erase block type of the block following erasure of the block prior to a power loss event, the means for handling being configured to: perform at least one read of the block following the power loss event; identify the erase block type of the block in response to the at least one read; and program the block based on the identified erase block type without performing a subsequent erase prior to the program.

Clause 20. The storage device of clause 19, wherein the block is initially associated with an initial erase block type, and the means for handling is further configured to: configure the block to change an association from the initial erase block type to the erase block type prior to the power loss event.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the disclosure include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

As used herein, a controller, at least one controller, and/or one or more controllers, individually or in combination, configured to perform or operable for performing a plurality of actions (such as the functions described supra) is meant to include at least two different controllers able to perform different, overlapping or non-overlapping subsets of the plurality of actions, or a single controller able to perform all of the plurality of actions. In one non-limiting example of multiple controllers being able to perform different ones of the plurality of actions in combination, a description of a controller, at least one controller, and/or one or more controllers configured or operable to perform actions X, Y, and Z may include at least a first controller configured or operable to perform a first subset of X, Y, and Z (e.g., to perform X) and at least a second controller configured or operable to perform a second subset of X, Y, and Z (e.g., to perform Y and Z). Alternatively, a first controller, a second controller, and a third controller may be respectively configured or operable to perform a respective one of actions X, Y, and Z. It should be understood that any combination of one or more controller each may be configured or operable to perform any one or any combination of a plurality of actions.

Similarly as used herein, a memory, at least one memory, a computer-readable medium, and/or one or more memories, individually or in combination, configured to store or having stored thereon instructions executable by one or more controllers or processors for performing a plurality of actions (such as the functions described supra) is meant to include at least two different memories able to store different, overlapping or non-overlapping subsets of the instructions for performing different, overlapping or non-overlapping subsets of the plurality of actions, or a single memory able to store the instructions for performing all of the plurality of actions. In one non-limiting example of one or more memories, individually or in combination, being able to store different subsets of the instructions for performing different ones of the plurality of actions, a description of a memory, at least one memory, a computer-readable medium, and/or one or more memories configured or operable to store or having stored thereon instructions for performing actions X, Y, and Z may include at least a first memory configured or operable to store or having stored thereon a first subset of instructions for performing a first subset of X, Y, and Z (e.g., instructions to perform X) and at least a second memory configured or operable to store or having stored thereon a second subset of instructions for performing a second subset of X, Y, and Z (e.g., instructions to perform Y and Z). Alternatively, a first memory, a second memory, and a third memory may be respectively configured to store or have stored thereon a respective one of a first subset of instructions for performing X, a second subset of instruction for performing Y, and a third subset of instructions for performing Z. It should be understood that any combination of one or more memories each may be configured or operable to store or have stored thereon any one or any combination of instructions executable by one or more controllers or processors to perform any one or any combination of a plurality of actions. Moreover, one or more controllers or processors may each be coupled to at least one of the one or more memories and configured or operable to execute the instructions to perform the plurality of actions. For instance, in the above non-limiting example of the different subset of instructions for performing actions X, Y, and Z, a first controller may be coupled to a first memory storing instructions for performing action X, and at least a second controller may be coupled to at least a second memory storing instructions for performing actions Y and Z, and the first controller and the second controller may, in combination, execute the respective subset of instructions to accomplish performing actions X, Y, and Z. Alternatively, three controllers may access one of three different memories each storing one of instructions for performing X, Y, or Z, and the three controllers may in combination execute the respective subset of instruction to accomplish performing actions X, Y, and Z. Alternatively, a single controller may execute the instructions stored on a single memory, or distributed across multiple memories, to accomplish performing actions X, Y, and Z.

The various aspects of this disclosure are provided to enable one of ordinary skill in the art to practice the exemplary embodiments of the present disclosure. Various modifications to exemplary embodiments presented throughout this disclosure will be readily apparent to those skilled in the art, and the concepts disclosed herein may be extended to other storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A method for handling detection and operations associated with a metablock that includes a plurality of blocks in one or more non-volatile memories of a storage device following erasure of at least one of the plurality of blocks prior to a power loss event, the method comprising:
    performing at least one read of a page in each block included in the metablock following the power loss event;
    identifying, based on the at least one read, an erase block type of each block included in the metablock based on a number of bits read from the page in each block and one or more bit count thresholds, wherein at least one of the plurality of blocks is identified as a multi-level cell (MLC) erase block type; and
    performing a metablock operation associated with the erase block type without erasing the metablock prior to the metablock operation in response to the identified erase block type being same for each of the blocks.

2. The method of claim 1, wherein the at least one read of the page in each block is an MLC read of the page, and wherein the method further comprises:
    determining whether a number of bits corresponding to an MLC erase state which are read from the page is less than a bit count threshold, wherein the at least one of the plurality of blocks is identified as the MLC erase block type
    in response to the number of bits being less than the bit count threshold.

3. The method of claim 1, wherein the metablock is a first metablock, and wherein the method further comprises:
    performing an MLC read of a first page of a first block of a second metablock;
    determining whether a first number of bits corresponding to an erase state which are read from the first page is greater than or equal to a first bit count threshold;
    performing a single-level cell (SLC) read of the first page of the first block in response to the first number of bits being greater than or equal to the first bit count threshold when performing the at least one read of the first block;
    determining whether a second number of bits corresponding to an SLC erase state which are read from the first page is less than a second bit count threshold; and
    identifying the erase block type to be SLC in response to the second number of bits being less than the second bit count threshold.

4. The method of claim 1, wherein
    determining whether at least one of the blocks is an erase aborted block;
    erasing, prior to performing the metablock operation, the erase aborted block based on the identified erase block type without subsequently programming and re-erasing the erase aborted block.

5. The method of claim 1, wherein the metablock is a first metablock, and wherein the method further comprises:
    performing the at least one read of a first page in a first block included in a second metablock;
    identifying the erase block type of the first block based on a number of bits read from the first page and one or more bit count thresholds;
    determining that a second block of the second metablock is not the same erase block type as the first block;
    erasing, without subsequently programming and re-erasing the first block, the first block based on the first block being a different erase block type relative to the second block; and
    perform a metablock operation associated with the second block after the erase of the first block.

6. The method of claim 5, wherein the identified erase block type of the first block is single-level cell (SLC), and the different erase block type of the second block is multi-level cell (MLC).

7. The method of claim 1, wherein the one or more blocks are initially associated with an initial erase block type, and the method further comprises:
    changing an association from the initial erase block type to the erase block type prior to the power loss event.

8. The method of claim 1, wherein the power loss event is an ungraceful shutdown (UGSD) of the storage device.

9. A storage device, comprising:
    one or more non-volatile memories comprising a metablock that includes a plurality of blocks; and
    means for handling detection and operations associated with the metablock following erasure of at least one of the plurality of blocks prior to a power loss event, the means for handling being configured to:
        perform at least one read of a page in each block included in the metablock following the power loss event;
        identify, based on the at least one read, an erase block type of each block included in the metablock based on a number of bits read from the page in each block and one or more bit count thresholds, wherein at least one of the plurality of blocks is identified as a multi-level cell (MLC) erase block type; and
        perform a metablock operation associated with the erase block type without erasing the metablock prior to the metablock operation in response to the identified erase block type being same for each of the blocks.

10. The storage device of claim 9, wherein the one or more blocks are initially associated with an initial erase block type, and the means for handling is further configured to:
    change an association from the initial erase block type to the erase block type prior to the power loss event.

11. A storage device, comprising:
    one or more non-volatile memories comprising a metablock that includes a plurality of blocks; and
    one or more controllers each communicatively coupled with at least one of the one or more non-volatile memories, the one or more controllers, individually or in any combination, operable to cause the storage device to:
- erase one or more blocks of the plurality of blocks prior to a power loss event, wherein each of the plurality of blocks is associated with an erase block type;
- perform at least one read of a page in each block included in the metablock following the power loss event;
- identify, based on the at least one read, the erase block type of each block included in the metablock based on a number of bits read from the page in each block and one or more bit count thresholds, wherein at least one of the plurality of blocks is identified as a multi-level cell (MLC) erase block type; and
- perform a metablock operation associated with the erase block type without erasing the metablock prior to the metablock operation in response to the identified erase block type being same for each of the blocks.

12. The storage device of claim 11, wherein the at least one read of the page in each block is an MLC read of the page, and wherein the one or more controllers, individually or in combination, are further operable to cause the storage device to:
- determine whether a number of bits corresponding to an MLC erase state which are read from the page is less than a bit count threshold, wherein the at least one of the plurality of blocks is identified as the MLC erase block type in response to the number of bits being less than the bit count threshold.

13. The storage device of claim 11, wherein the metablock is a first metablock, and wherein the one or more controllers, individually or in combination, are further operable to cause the storage device to:
- perform an MLC read of a first page of a first block of a second metablock;
- determine whether a first number of bits corresponding to an erase state which are read from the first page is greater than or equal to a first bit count threshold;
- perform a single-level cell (SLC) read of the first page of the first block in response to the first number of bits being greater than or equal to the first bit count threshold when performing the at least one read of the first block;
- determine whether a second number of bits corresponding to an SLC erase state which are read from the first page is less than a second bit count threshold; and
- identify the erase block type to be SLC in response to the second number of bits being less than the second bit count threshold.

14. The storage device of claim 11, wherein the one or more controllers, individually or in combination, are further operable to cause the storage device to:
- determine whether at least one of the blocks is an erase aborted block;
- erase, prior to performing the metablock operation, the erase aborted block based on the identified erase block type without subsequently programming and re-erasing the erase aborted block.

15. The storage device of claim 11, wherein the metablock is a first metablock, and wherein the one or more controllers, individually or in combination, are further operable to cause the storage device to:
- perform the at least one read of a first page in a first block included in a second metablock;
- identify the erase block type of the first block based on a number of bits read from the first page and one or more bit count thresholds;
- determine that a second block of the second metablock is not the same erase block type as the first block;
- erase, without subsequently programming and re-erasing the first block, the first block based on the first block being a different erase block type relative to the second block; and
- perform a metablock operation associated with the second block after the erase of the first block.

16. The storage device of claim 15, wherein the identified erase block type of the first block is single-level cell (SLC), and the different erase block type of the second block is multi-level cell (MLC).

17. The storage device of claim 11, wherein the one or more blocks are initially associated with an initial erase block type, and the one or more controllers, individually or in combination, are further operable to cause the storage device to:
- change an association from the initial erase block type to the erase block type prior to the power loss event.

18. The storage device of claim 11, wherein the power loss event is an ungraceful shutdown (UGSD) of the storage device.

* * * * *